(12) United States Patent
Hernandez-Rivera et al.

(10) Patent No.: US 11,567,337 B1
(45) Date of Patent: Jan. 31, 2023

(54) GRAZING ANGLE PROBE MOUNT FOR QUANTUM CASCADE LASERS

(71) Applicants: Samuel P. Hernandez-Rivera, Mayaguez, PR (US); Leonardo C. Pacheco-Londono, Mayaguez, PR (US)

(72) Inventors: Samuel P. Hernandez-Rivera, Mayaguez, PR (US); Leonardo C. Pacheco-Londono, Mayaguez, PR (US)

(73) Assignee: University of Puerto Rico, San Juan, PR (US)

( * ) Notice: Subject to any disclaimer, the term of this patent is extended or adjusted under 35 U.S.C. 154(b) by 357 days.

(21) Appl. No.: 16/184,982

(22) Filed: Nov. 8, 2018

Related U.S. Application Data

(60) Provisional application No. 62/583,084, filed on Nov. 8, 2017.

(51) Int. Cl.
| | |
|---|---|
| *G02B 27/09* | (2006.01) |
| *H01S 5/00* | (2006.01) |
| *G01N 21/3563* | (2014.01) |
| *H01S 5/34* | (2006.01) |
| *G01N 21/35* | (2014.01) |

(52) U.S. Cl.
CPC ..... *G02B 27/0955* (2013.01); *G01N 21/3563* (2013.01); *G02B 27/0977* (2013.01); *H01S 5/0071* (2013.01); *G01N 2021/3595* (2013.01); *G01N 2201/0612* (2013.01); *H01S 5/3402* (2013.01)

(58) Field of Classification Search
CPC ............... G02B 27/0955; G02B 27/09; G02B 27/0977; G01N 21/3563; G01N 21/00; G01N 21/01; G01N 21/17; G01N 21/25; G01N 21/31; G01N 21/35; G01N 21/3581; G01N 2021/3595; G01N 2201/0612; H01S 5/0071; H01S 5/3402

See application file for complete search history.

(56) References Cited

U.S. PATENT DOCUMENTS

2012/0033220 A1\* 2/2012 Kotidis ................. G01J 3/4338
356/445

\* cited by examiner

*Primary Examiner* — Stephone B Allen
*Assistant Examiner* — Adam W Booher
(74) *Attorney, Agent, or Firm* — Hoglund & Pamias, PSC; Roberto J. Rios

(57) ABSTRACT

A simple optical layout for a grazing angle probe mount that allows coupling to a mid-infrared (MIR), laser-based spectrometer is provided. The assembly enables doing reflectance measurements at high incident angles. In the case of optically thin films and deposits on MIR reflective substrates, a double pass effect, accompanied by absorption by the chemicals or biological samples deposited in an Infrared Reflection-Absorption Infrared Spectroscopy (IRRAS) modality is achieved. The optical system includes a probe that allows the passage of MIR light through the same sampling area twice. Initially, the infrared beam produces a spot on the surface, and then the light is returned in back reflection to the sample surface producing a new little slightly larger spot onto the selfsame position.

1 Claim, 25 Drawing Sheets

GRAZING ANGLE PROBE MOUNT FOR QUANTUM CASCADE LASERS

BACKGROUND OF THE INVENTION

In situ trace level detection and identification of pollutants, threat chemical residues and biofilms (films containing microorganisms) on surfaces is important for rapid and effective screening in different fields such as homeland security, defense, environmental sampling, clean validation in pharmaceutical and biotechnology industries and others. For homeland security applications, fast trace detection of chemical and biological threat agents on contaminated surfaces is fundamental in the prevention, rapid performance, and execution of security protocols. Mid infrared (MIR) spectroscopy practiced at or near grazing angle of incidence is probably the most powerful technique for surface analysis of monolayers of chemicals and microorganisms deposited on surfaces. At high incident angles of a polarized MIR source, the phenomenon known as Reflection Absorption Infrared Spectroscopy (RAIS; known also as Infrared Reflection Absorption Spectroscopy or IRRAS) takes place. However, since the samples are so optically thin, relatively long analysis times (from 5 to 120 min of integration) are typically required to obtain spectra with good signal to noise ratios (S/N) to fully take advantage of the power within RAIS experiments. This is due to the absorbance of monolayers being low because of the low number density of molecules (microorganisms) present in the path of the MIR beam.

Moreover, typical MIR sources have inherently low optical powers, as is the case of thermal sources such as globars. The integration time can be reduced by multi-reflection passes because the absorbance increases as is the case in multi-pass cells used for phase gas analysis. However, there are significant light intensities losses at MIR mirrors, which do not have the high reflectivities that can be achieved in mirrors for the visible and ultraviolet-coated. Moreover, scattering by imperfections of the substrates that contain the samples, MIR beam divergence, and absorption by substrates, samples, and mirrors causes even more light losses.

The need to develop more powerful MIR sources that enable RAIS data when a target chemical or microorganisms is deposited on substrates at trace levels suggests the use of collimated, coherent, and polarized sources. The ideal solution to many of these problems is to use a MIR tunable laser. This type of source was first developed in 1994 at Bell Labs with the invention of the most well-known of these devices: the quantum cascade lasers (QCLs). A QCL is a unipolar semiconductor injection laser based on sub-interband transitions in a multiple quantum-wells heterostructure. As a semiconductor laser that can produce varying wavelengths and operate at various temperatures, this type of laser has various advantages over other types of lasers. QCLs can produce from a few tens to hundreds of milliwatts of continuous or pulsed modes power under ambient conditions. A QCL is an ideal source for RAIS experiments due to its properties such as the high brightness: six (6) orders of magnitude larger than those of conventional thermal sources (e.g., globars), portability, high optical power output, room temperature operation, low energy consumption, long-term power stability, and the ability to fine-tune the output frequency.

Infrared spectroscopy (IRS) operating in the mid IR (MIR) region with near grazing angle of incidence (approximately 80-82° from the surface normal) is considered one of the most sensitive optical absorption techniques. The technique can be used to measure low concentrations of chemical compounds deposited on surfaces such as metals, glasses, and plastics. Low Limits of Detection (LOD) values ranging from 10 to 50 $ng/cm^2$ of single analyte have been accomplished using thermal excitation sources and Fourier Transform Infrared (FT-IR) spectroscopy. This technique can also be applied to quantify Active Pharmaceutical Ingredients (APIs) in mixtures on metallic surfaces. Detection on other surfaces such as glass and plastic surfaces allows the design of methodologies with clear advantages in comparison with the traditional time-consuming swab-based HPLC method.

If a film or coating of some sort exists on a smooth surface, the light beam passes through the coating, reflects off the smooth substrate and passes through the coating a second time as illustrated in FIG. 1. This phenomenon is called double transmission or Reflection Absorption Infrared Spectroscopy (RAIS). Typical RAIS spectra are reported in terms of the measured absorbance defined as $A=Log(Rr/Rs)$ where: Rr is the reflectance of the of the plate (substrate), and Rs is the reflectance of the sample and substrate combined (sample/substrate).

The best experimental conditions for obtaining RAIS spectra are at the grazing angle (~80°) with the radiation polarized parallel to the plane of incidence (p-polarization, FIG. 2). It can be appreciated that s-polarized light is almost canceled by reflection at grazing angle while the p-polarized light is almost intensity doubled at grazing incidence. Under such conditions, the surface electric field of the resulting stationary wave is normal to the metal plane and presents an enhanced intensity due to constructive interference.

Using RAIS spectra for analytes deposited on metallic surfaces is thus a very sensitive technique for investigating vibrations of molecules with the transition moments oriented perpendicular to the thin surface (FIG. 3). Observations of vibrational modes of adsorbates on metallic substrates are subject to the surface dipole selection rules. Among other things, these rules state that only those vibrational modes which give rise to an oscillating dipole perpendicular (normal) to the surface are IR active and give rise to an observable absorption band.

However, this technique is nearly insensitive for transition moments oriented in the plane of the film because the electric field perpendicular to the plane of incidence (s-polarization) is almost zero. Also, intermediate results are obtained for not-chemical bonds that are not aligned perpendicular or parallel to the surface. Accordingly, the technique also serves as a tool to infer the orientation of molecules deposited on substrate surfaces.

Thus, what is needed is a two reflection passes optical probe mount operating as close as possible to the grazing angle and coupling it to a widely MIR laser source to reduce the time analysis and improves S/N of RAIS spectra to achieve very low limits of detection of explosives and microorganisms.

SUMMARY OF THE INVENTION

The present invention provides a two reflection passes optical probe mount operating as close as possible to the grazing angle and coupling it to a widely MIR laser source.

In accordance to an aspect of the invention, the device reduces the time analysis and improves S/N of RAIS spectra to achieve very low limits of detection of explosives and microorganisms.

According to another aspect of the invention, further signal enhancement can be obtained by applying powerful multivariate chemometrics routines to the RAIS data. This allows for discrimination from vibrational signals originating from highly MIR absorbing substrates (such as plastics, including Teflon® and polyacrylate plates), from interferences (such as dirt, and other components), from other chemicals in mixtures (such as C-4 and Semtex-H), and from other microorganisms in mixes of potential biothreats.

BRIEF DESCRIPTION OF THE DRAWINGS

Further features and advantages of the invention will become apparent from the following detailed description taken in conjunction with the accompanying figure showing illustrative embodiments of the invention, in which.

Throughout the figures, the same reference numbers and characters, unless otherwise stated, are used to denote like elements, components, portions or features of the illustrated embodiments. The subject invention will be described in detail in conjunction with the accompanying figures, given the illustrative embodiments.

DETAILED DESCRIPTION OF THE INVENTION

MATERIALS AND METHODS

Instrumentation

A QCL-based pre-dispersive spectrometer (LaserScan™, Block Engineering, Marlborough, Mass., USA) equipped with a thermoelectrically cooled mercury-cadmium-telluride (MCT) detector and three tunable MIR lasers with working ranges from 1000 to 1428 cm$^{-1}$ was used to obtain spectral information from the samples. The average power typically varied between 0.5 to 10 mW across the 428 cm$^{-1}$ tuning range. The laser source had an elliptical output beam spot 2×4 mm$^2$ at the focal plane and could be tuned across the spectral range in approximately 0.5 s. Other laser parameters included a polarization ratio of 100:1 of single transverse electromagnetic mode (TEM$_{00}$) and beam divergence of <2.5 mrad in the x-axis and <5 mrad in the y-axis. The wavenumber accuracy and precision were 0.5 cm$^{-1}$ and 0.2 cm$^{-1}$, respectively. The LaserScan™ produced monochromatic light in the MIR with a spectral linewidth of 2 cm$^1$. The maximum frequency was tuned in time with a speed of 15 cm$^{-1}$/ms acquiring a total of 2192 points. This is equivalent to 1 point every 13 μs.

Optical System

Figure 4:
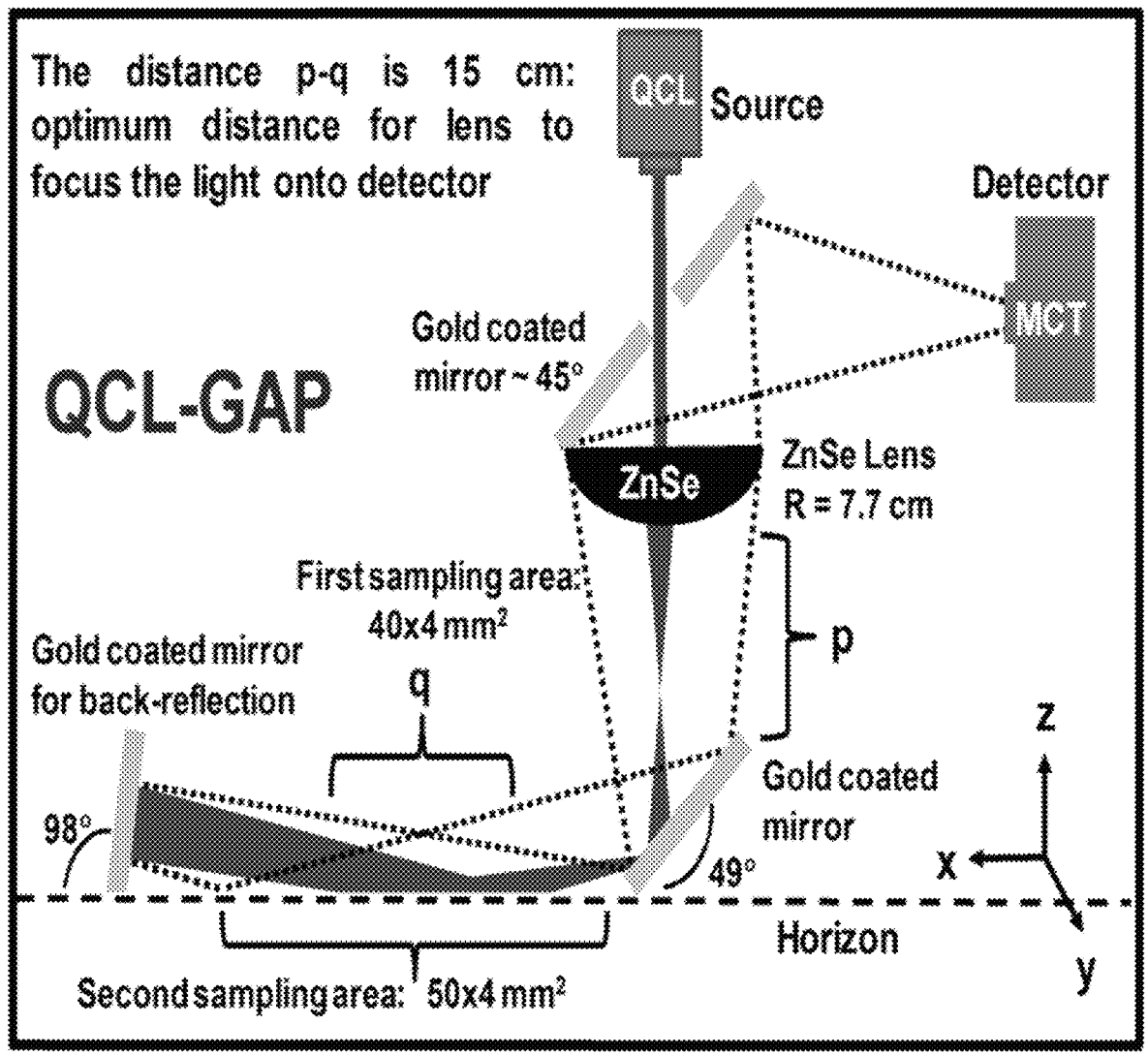
FIG. 4 shows a schematic representation for coupling a quantum cascade laser (QCL) to the grazing angle probe (GAP) optical mount, according to the present invention.
Figure 5:
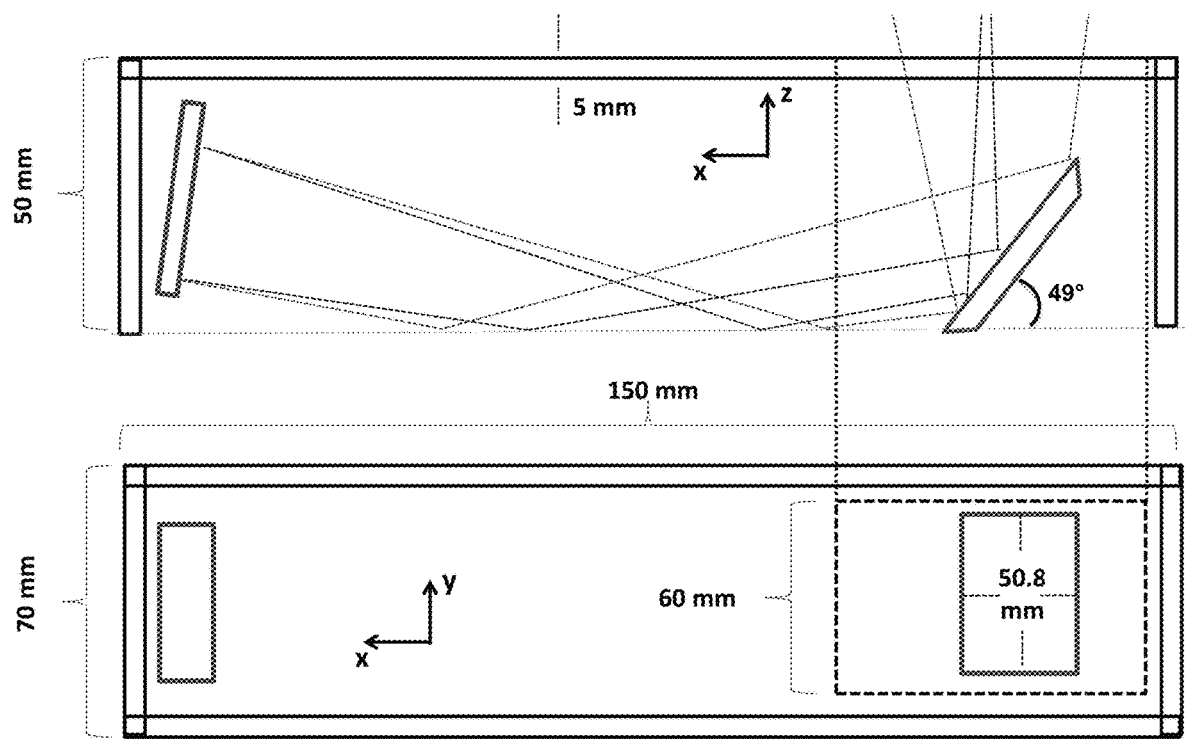
FIG. 5 shows the grazing angle probe mount for two-step pass with same spot area analyzed, according to the present invention.
Figure 6:
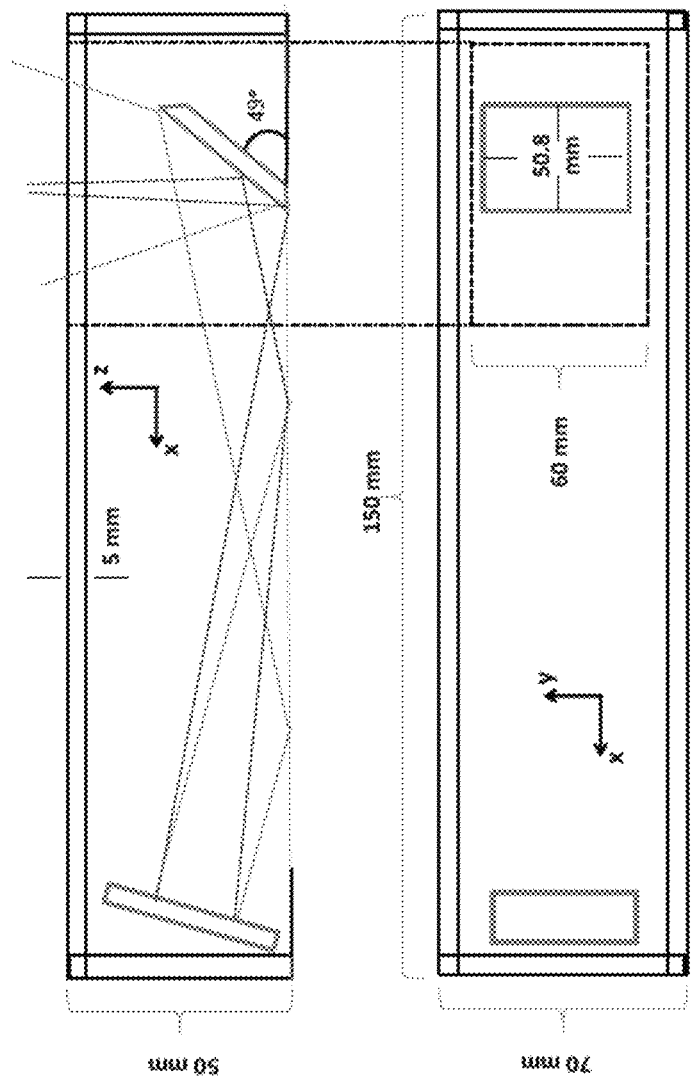
FIG. 6 shows the grazing angle probe mount for two-step pass with different spot areas analyzed, according to the present invention.

The MIR laser source was coupled to a compact optical probe with mirrors fixed near the grazing angle (~82°) were carefully coupled to improve detection, increase the signal to noise ratio (S/N), and reduce the time of analysis without compromising saturation of the detector. A general view of the grazing angle probe (GAP) is shown in FIG. 4. The beam was focused and expanded by a lens (ZnSe, 3 in. diam.) in the vertical direction (z-direction, as illustrated in FIGS. 4, 5 and 6). Next, the light was reflected by a gold-coated plane mirror at 49° of the surface, deflecting the light at an angle of 8° with respect to the surface (82° with respect to the surface normal) forming an elliptical beam image on the surface. As designed, the axial size of the ellipsoidal image of the MIR on the plane of the sample was 40×5 mm$^2$, on the first pass of the laser light. Next, the light was returned by a second gold coated plane mirror (8° with respect to normal) to the same surface producing a second, slightly larger spot at the same position on the sample of size 50×5 mm$^2$. Six spectra were acquired by moving the optical stage supporting the substrates to cover the total sampled area.

Figure 1:
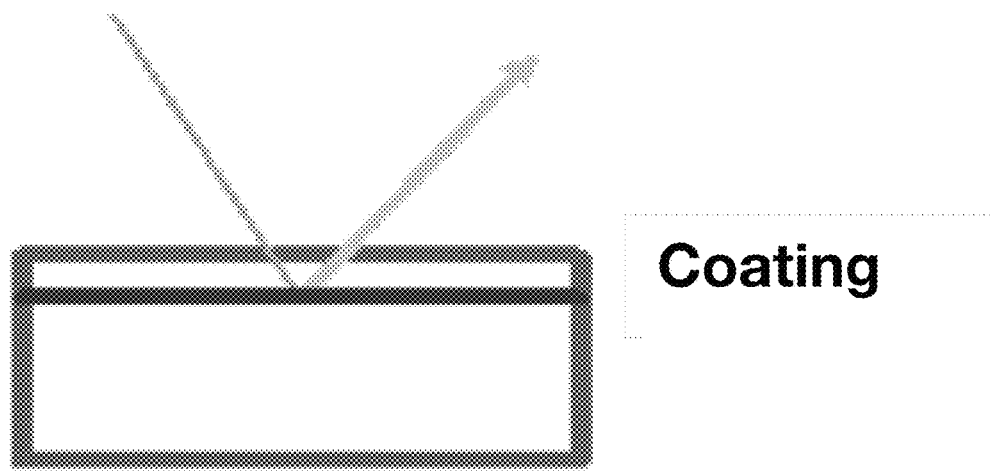
FIG. 1 illustrates an example of double transmission Reflection Absorption Infrared Spectroscopy (RAIS).
Figure 2:
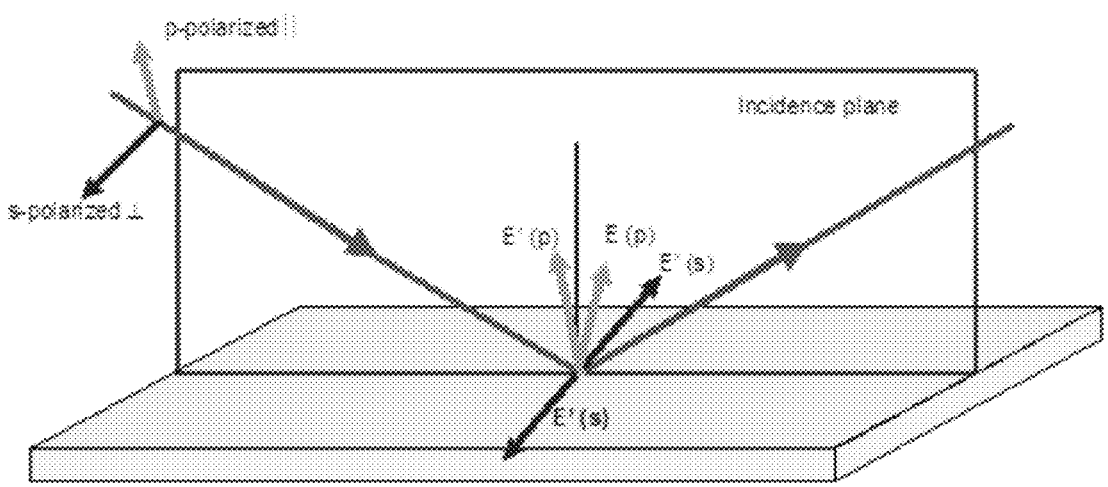
FIG. 2 illustrates the incidence of s and p radiation on a metal surface at the grazing angle.
Figure 3:
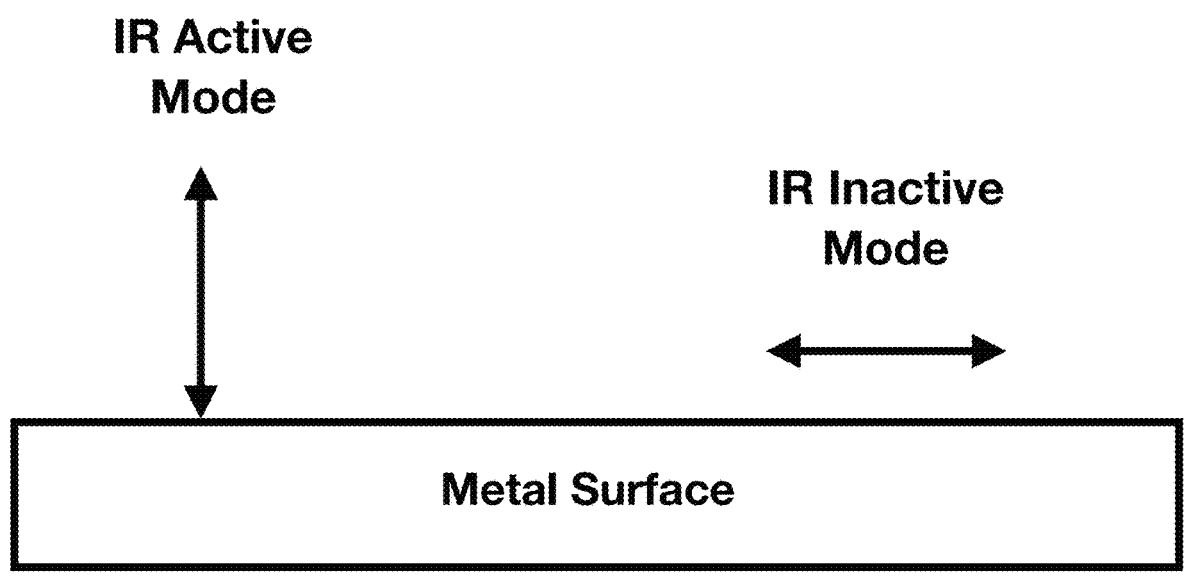
FIG. 3 illustrates the IR modes on a metal surface at the grazing angle.

It can be appreciated that FIG. 4 shows a beam configuration similar to that of FIG. 2, with the difference that the light is returned by a plane mirror (16° with respect to the normal), wherein this small change in the angle of the plane mirror produces a new light pattern, slightly larger alongside the surface and not exactly in the same position.

Reagents

The reagents used were the aliphatic explosive cyclotrimethylenetrinitramine (RDX), the API 2-n-butyl-3-((2'-(1H-tetrazol-5-4-yl)methyl)-1.3-diazaspiro(4,4)non-1-en-4-one or irbesartan (IRBS), and acetone (99.5%, GC grade), The API and acetone were purchased from Aldrich-Sigma Chemical Co. (Milwaukee, Wis.), and RDX was synthesized directly in the laboratory. Acetone was used as the solvent to deposit the analytes at various concentrations onto the SS plates used as substrates.

Sample preparation and data acquisition

A sample-smearing technique was used to deposit analytes on 2×2 in$^2$ (25.8 cm$^2$) SS plates. Substrates were first cleaned with acetone and left to dry in a hood to allow solvent evaporation before deposition of analytes. Stock solutions were prepared in for RDX (0.4-2.5 mg/L) and IRBS (0.5-3.1 mg/L) using acetone as solvent. One mL aliquots of the solutions were transferred onto the substrates, and the smearing was performed using the tip of a micropipette (~1 mm diameter), minimizing contact with the surface. This procedure reduced the amount of solution lost on the tip compared to the amount transferred when a flat surface is attached for sample smearing. The solutions covering all the SS surface were then placed on a well-leveled surface and left to dry for 10 min to promote solvent evaporation before acquiring the laser reflectance spectra. The total mass deposited (412-2581 ng for RDX) and (517-3097 ng for IRBS) was divided by the area of substrates (25.8 cm$^2$). The final nominal surface concentrations resulting from this process were ~16-100 ng/cm$^2$ for RDX and ~20-120 ng/cm$^2$ for IRBS.

Multivariate data analysis

Chemometric analyses were performed in MATLAB®8.6.0.267246 (R2015b; Math Works Inc. Natick, USA), PLS Toolbox 8.1 (Eigenvector Research, Inc., Wenatchee, Wash., USA) was used for discrimination and quantification analyses.

EXPERIMENTAL RESULTS

Mathematical treatment to estimate the surface concentration (Cs)

Figure 13A:
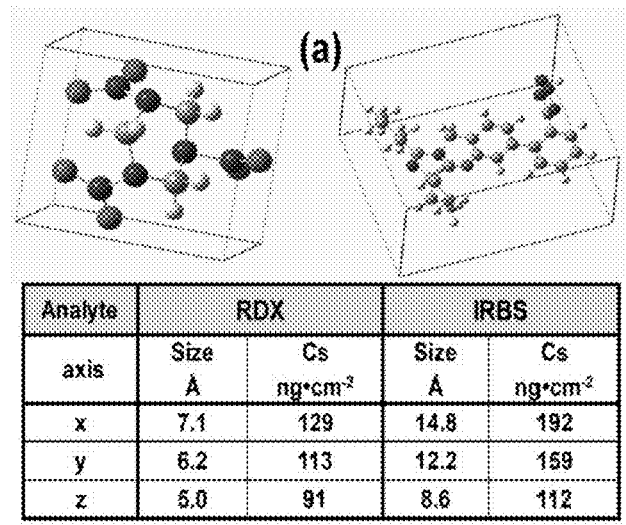
FIG. 13a shows the molecular structure and size of RDX and IRBS used for calculation of concentration of stock solutions.

Based on the density of the bulk material (D$_M$) and the molecular size (Ms), the surface concentrations (Cs) were calculated by multiplying both parameters, Cs=(D$_M$·Ms). If the distance between the molecules in bulk remains constant, the Cs value corresponds to a layer where the thickness is the molecular size. The value Ms was found using Gaussian 09 software. This theoretical analysis was performed using density functional theory (DFT) with Beckes' three parameter modification of the Lee-Yang-Parr hybrid functional (B3LYP) and 6-31++g(d,p) as the basis set. Previously, RDX and IRBS molecules were computed with full optimization to find the local minima as potential energy. Also, both molecules were positioned in a box, and the distances were determined (FIG. 13a).

The lowest Cs values were 91 and 112 ng/cm$^2$ for RDX and IRBS, respectively. As discussed above, these Cs values would apply to the present case if the distances between the molecules are the same as in bulk. However, the Cs values for monolayers are lower than these values. Assuming that the distances between the molecules are doubled in a monolayer, the values for Cs must be 4 to 5 times smaller than these. This reduces the Cs values to 15 to 30 ng/cm$^2$ RDX and 20 to 50 ng/cm$^2$ IRBS. These two ranges were used as a guide to prepare the standard concentrations. These later were from ~16 to 100 ng/cm$^2$ for RDX and from ~20 to 120 ng/cm$^2$ for IRBS.

Analysis of sample spectra

Figure 13B:
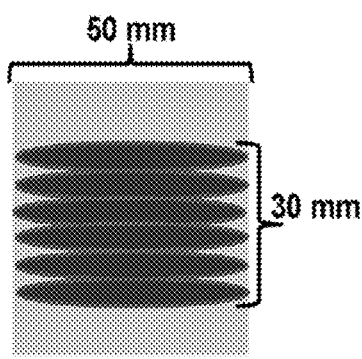
FIG. 13b shows the surface monitoring scheme for sample acquisition: spectra per sample and blanks were acquired by moving the optical stage supporting the substrates.

Irregularities on the surface can lead to analyte concentration gradients. This phenomenon is unavoidable in surface depositions and results in non-homogeneous distributions of analytes on surface. Because of this lack of homogeneity, the six spectra per analyte/SS were averaged to obtain a representative value for Cs (see FIG. 13b). Therefore, the of Cs is different for the analysis on a smaller area compared to the corresponding of the complete area. This is indicative that some hot areas (higher surface concentration) are formed, and this phenomenon prevents the formation of a monolayer or a homogenous film deposit. Fast evaporation of the solvent also leads to the formation of hot areas. To tackle this problem, two solutions were proposed. First, the beam image had to cover the entire area of the substrate containing the analyte. This ensured that the spectrum acquired was representative of the surface concentration. The second option was to acquire as many spectra as required to cover all of the substrate containing the analyte and then average the spectra obtained. This average spectrum was assumed as representative of the surface concentration. An effect of a non-homogenous distribution of the analyte concentration can be reflected in the amplitudes (peak heights) and intensities (integrated areas under peaks) of the spectroscopic signals. Therefore, the spectral measurement of more than one region ensures the representativeness of the information obtained from the total sample. In this invention, a combination of both methodologies was applied. The prototype GAP optical system expanded the laser image of the MIR laser light much more in one direction (x-direction: FIG. 4), forming an ellipsoid. To cover a wider area on the sample surface in the other direction (y-direction: FIG. 4), several spectra (ellipsoidal strips) were acquired as illustrated in FIG. 13b. Thus, QCL-GAP reflectance spectra were systematically measured in six contiguous regions, each separated 5 mm from the next region. Six spectra were logged for each analyte/SS combination and SS blanks. The area of each elliptical image of the QCL beam projected onto the analyte/substrate surface was 1.96 $cm^2$ for a total area sampled of 11.8 $cm^2$ (1.96 $cm^2$×6 ellipsoidal strips; see FIG. 13b) of a total sample surface area of 25.8 $cm^2$ (~46% substrate coverage). The image form (ellipsoidal) and dimensions (50 mm, major axis; 5 mm, minor axis) were confirmed using a thermal image capturing camera for mobile phones (Compact™, SEEK Thermal Inc., Santa Barbara, Calif., USA; image not shown).

Analysis of interference patterns and signal preprocessing treatment

Figure 14A:
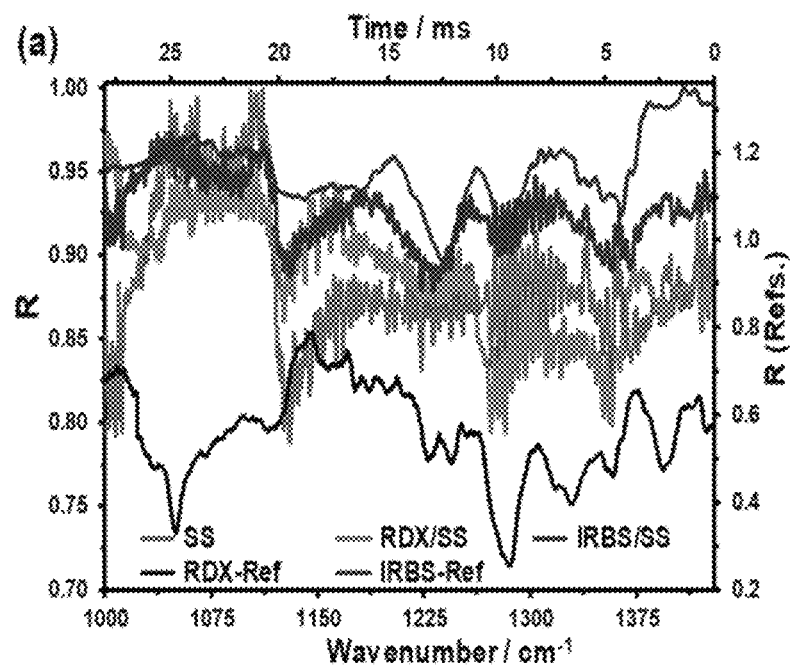
FIG. 14a shows a comparison of average spectra of clean SS substrate, RDX/SS (~16 ng/cm2), IRBS/SS (~60 ng/cm2) and their reference QCL reflectance spectra.
Figure 14B:
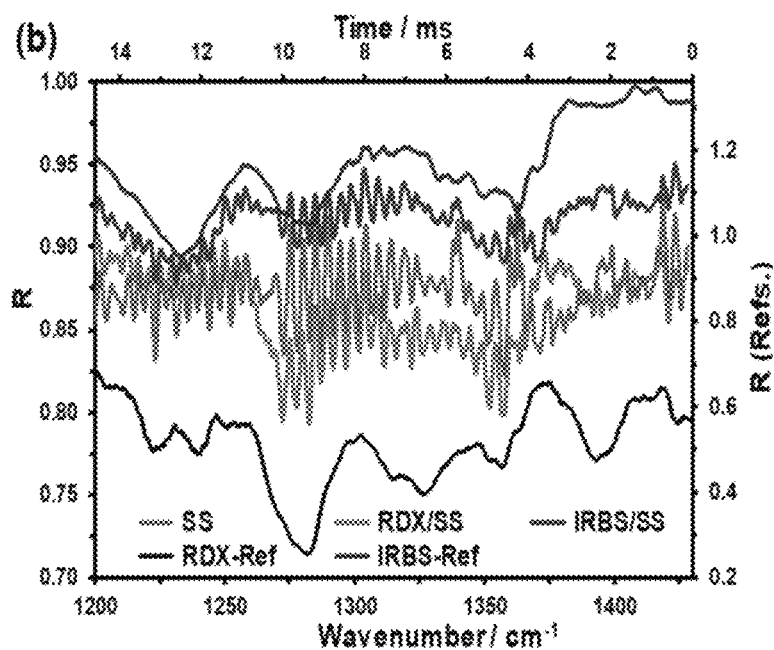
FIG. 14b shows zoom of spectra (1200-1428 cm-1) showing details of the band patterns of the analytes overlapped by the interference fringes.
Figure 14C:
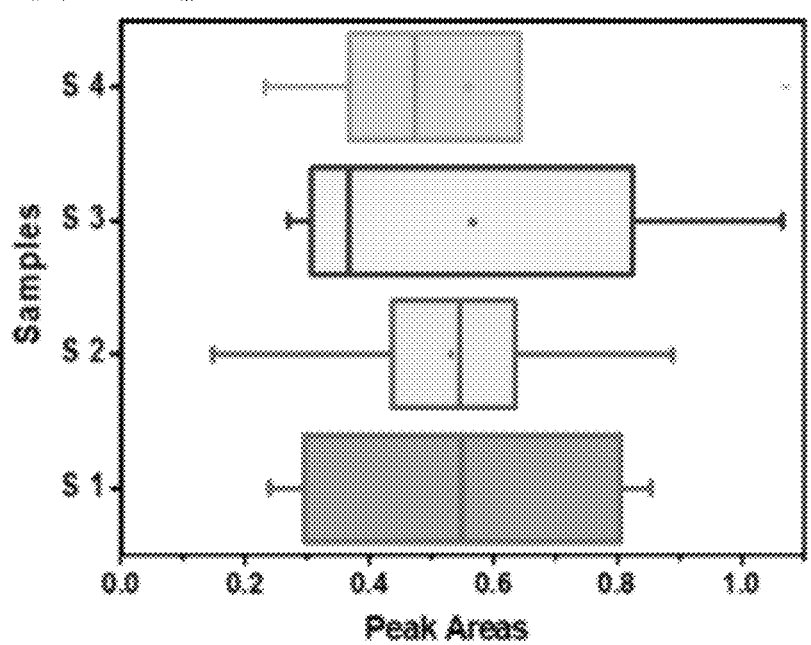
FIG. 14c shows a box plot for the peak area at the 1358-1386 cm-1 spectral region for 100 ng/cm2.
Figure 14D:
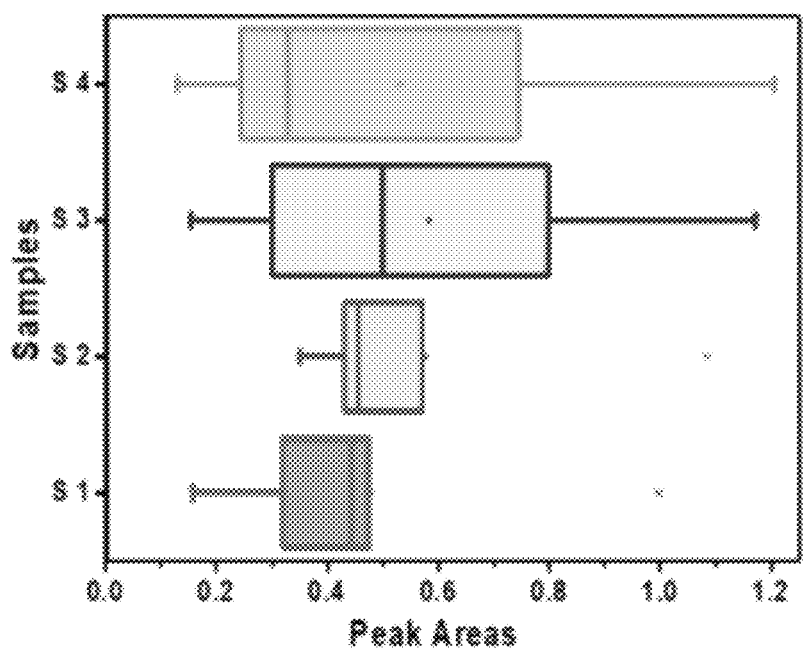
FIG. 14d shows a box plot for the peak area at the 1358-1386 cm-1 spectral region for 70 ng/cm2.
Figure 14E:
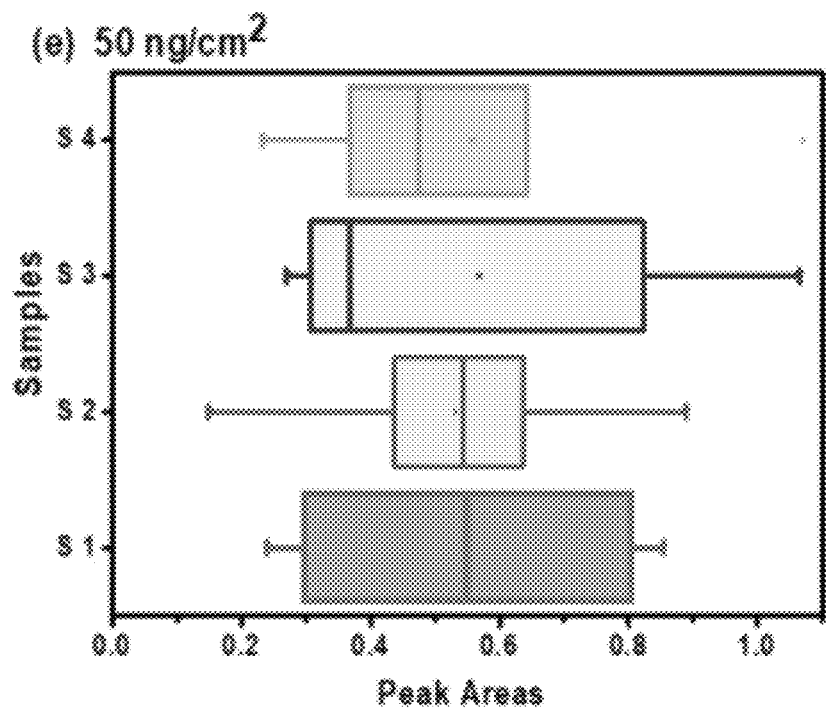
FIG. 14e shows a box plot for the peak area at the 1358-1386 cm-1 spectral region for 50 ng/cm2.
Figure 14F:
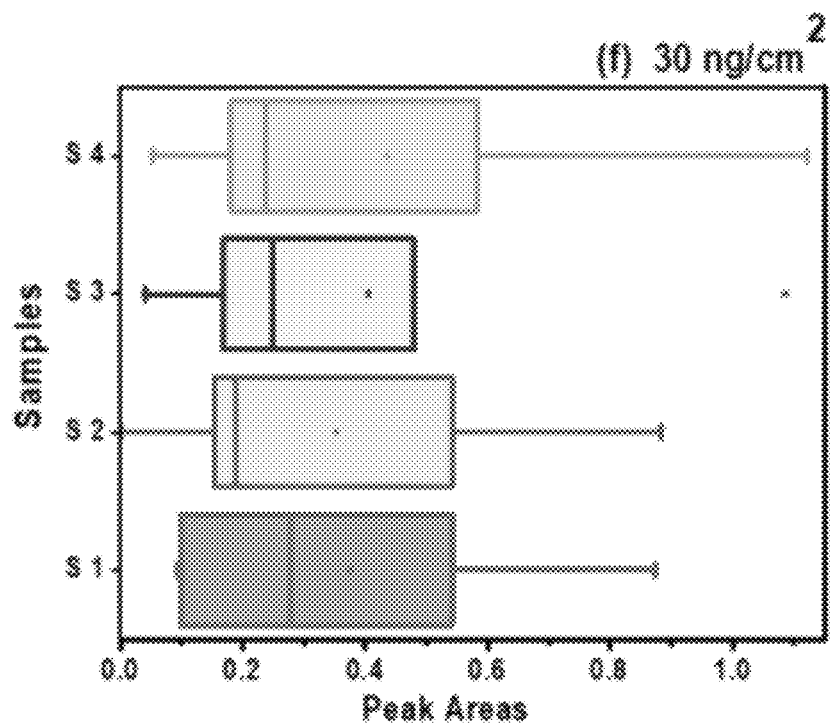
FIG. 14f shows a box plot for the peak area at the 1358-1386 cm-1 spectral region for 30 ng/cm2.

FIGS. 14a-14b show typical spectra of the clean substrate (SS) and representative spectra of the substrate with the analytes loaded (RDX/SS and IRBS/SS) at 16 $ng/cm^2$ RDX and 20 $ng/cm^2$ IRBS. Reference spectra for RDX and IRBS are also included. The reference spectra were acquired with the QCL system operating in diffuse reflection mode for bulk samples. Interference patterns were obserbed in the spectra of the clean substrate and the spectra of the substrate loaded with the analytes (FIGS. 14a-14b). These patterns are due to the interference of the light by multiple reflections on the surface. By narrowing the spectral range from 1200 to 1428 $cm^{-1}$ some of the characteristic signals of IRBS and RDX could be observed embedded in the interference patterns. Variation of the interference patterns depending on whether the substrate was clean or loaded with the analytes was also noted. Some signals were observed with difficulty in the RDX spectra, such as the ones tentatively assigned to the $NO_2$ symmetric stretch at 1275 $cm^{-1}$ and the N-N symmetric stretch at 1358 $cm^{-1}$. In addition, IRBS signals at 1236 $cm^{-1}$ tentatively assigned to δNNH +vNN +vC-C bridge bond biphenyl and at 1337.11 $cm^{-1}$ corresponding to $CH_2$ wagging were observed.

To determine the distribution of the surface concentration of analytes on the substrates, box plots for the peak area at 1350-1375 $cm^{-1}$ region for six spectra of RDX at various areas on the samples surfaces was generated (see FIG. 13b). Several surface concentrations in the range of 100-30 $ng/cm^2$ (see FIGS. 14c-14f) were used for the plots. The homogeneity was very low on the surface because the analyte distribution on the substrate surface was not uniform resulting in a wide range of peak areas. However, the average value of the distributions (cross in FIGS. 14c-14f) was similar among the samples studied. This suggests that the proposed goal of having a spatial average of the concentration of the analyte was well met. Thus, the proposed methodology warrants that the average spectra are representative of the loaded surface concentration.

Figure 14G:
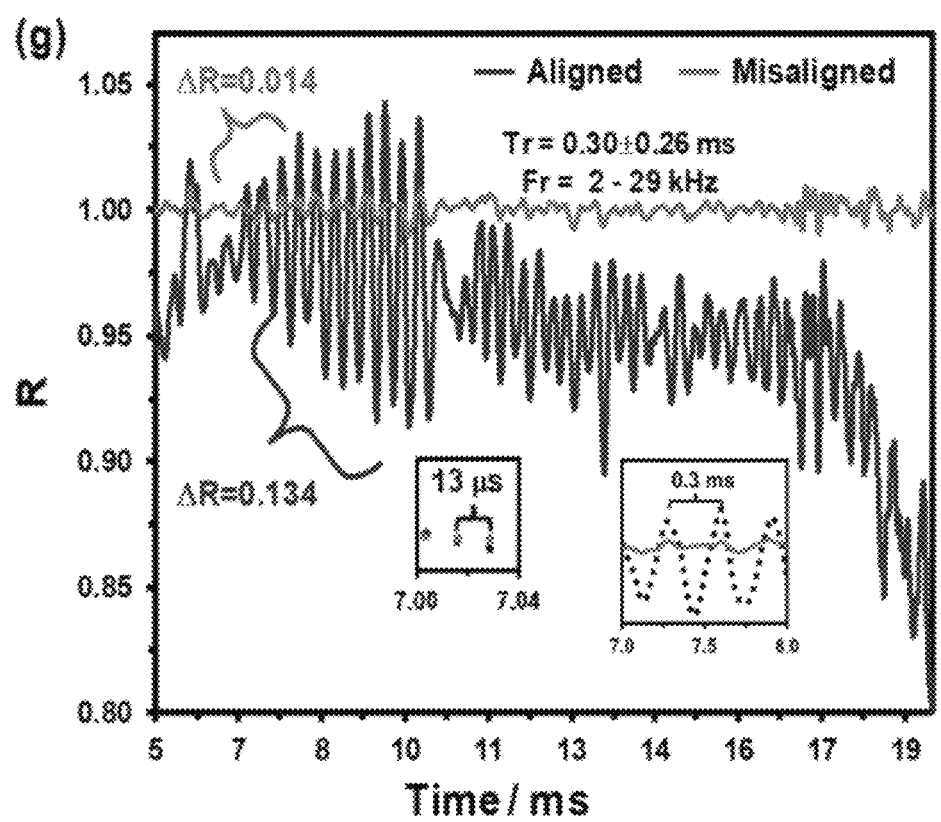
FIG. 14g shows QCL reflectance spectra for SS substrate of the aligned system and misaligned system. Insert: statistical measures of interference fringes in time (Tr) and frequency (Fr) and their representation. Insert: representation of the minimum acquisition time.

FIG. 14g shows the spectra for the SS substrate, using the same substrate for the background run. The blue trace is the spectrum acquired under highly aligned mirrors, and the red trace is the corresponding spectrum with the GAP with mirrors not well aligned (misaligned). The strong signals observed from the clean substrate are due to the interference patterns generated and not from substrate signals. The figure also portraits the enhancement of the intensity of the reflectance signals when the GAP mirrors are well aligned vs. the corresponding spectrum for a likely misalignment of the GAP optical system. The difference in intensity of the interference patterns is ~10× for highly aligned GAP mirrors with respect to not well-aligned mirrors. The aligned spectrum shows a slope due to the substrate which is not completely compensated for even if the same substrate is used as background. This is because the aligned system is highly sensitive to small positional changes of the sample. There are two insets in FIG. 14g: one showing the average time between two consecutive maxima in the interference pattern (Tr): 0.30 ms with a standard deviation of ±0.26 ms. This is equivalent to an average frequency of 3.3 kHz and a frequency range (Fr) of 2 to 29 kHz. The second insert shows the time between acquisition points: 13 µs (see FIG. 14g).

Figure 15A:
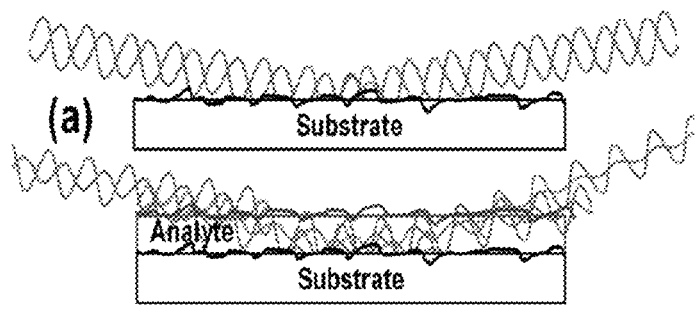
FIGS. 15a and 15b show a representation of interference patterns, application of FFT preprocessing and representative spectral patterns obtained after applying FFT preprocessing.
Figure 15B:
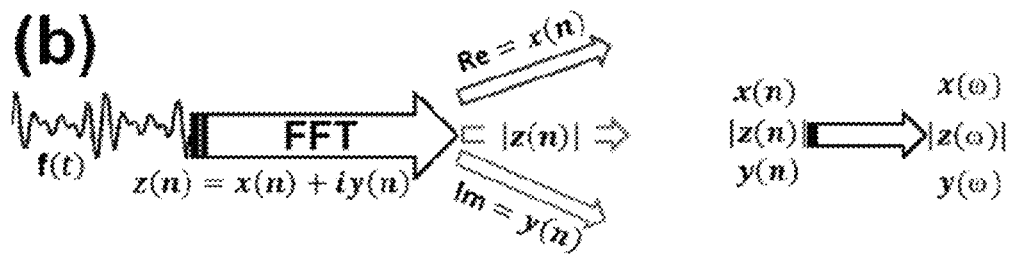
Figure 15C:
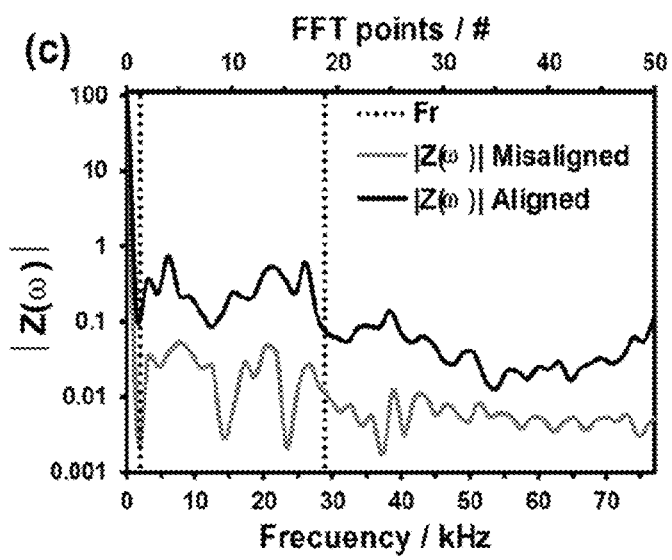
FIG. 15c shows FFT spectrum for n=100 from QCL reflectance spectrum for SS substrate for the aligned and misaligned system.

To explain how the presence of the analyte on the surface changed the interference pattern and to discriminate between the spectra for analytes on substrates and spectra for clean surfaces, the interference signals of each sample were transformed and explored. FFT was applied as a preprocessing step to the data, as illustrates in FIG. 15a. The figure shows and illustration of the wave behavior when the surface is clean and when it has analyte deposited on it. Here, a single reflection representation is observed when the surface is clean. Multiple reflections are generated by the semi-transparent analytes when low concentrations are deposited. This interaction of the light with the surface causes a modification of the interference patterns depending on the analyte and the concentration deposited. FIGS. 15a-15b show representations of the FFT preprocessing. The transformation of the data with FFT preprocessing produces a complex function (the Fourier transformation). This function consists of an imaginary part [Im(n)] and a real part [Re(n)], while the magnitude of the function is expressed as the absolute values pf |z(n)|, "n" represents the number of points used in the FFT. These parameters were used for the analysis to have a good model to represent the spectral data and to recover the spectral features embedded within the interference patterns. FIG. 15c shows the FFT spectra in frequency space (ω:0-78 kHz), for a clean SS substrate under well-aligned mirrors and under not well aligned (misaligned) GAP mirrors. It is evident that the intensity of the signals is higher in the aligned system than the misaligned case. This indicates that the alignment is critical if quantification is desired. Almost all the modes in the aligned setup can be observed in the misaligned setup.

Pattern recognition analysis

The preprocessing functions obtained from applying the FFT to the data were based on the number of points (n) used for the Fourier transform. For further, analyses, these functions were transformed to the frequency domain (ω). To achieve this transformation, a linear function between n and ω was found. The sampling period was 13 µs for a sampling frequency (Fs) of 78 kHz. This frequency is equivalent to a value of $n_{MAX}$ for the length of signal (L) that contains 2192 points and a total scan time of 28.5 ms. Thus, the relationship between ω and n is:

$$\omega=78\cdot[(n-1)/(n_{MAX}-1)]\text{kHz} \tag{1}$$

Figure 16A:
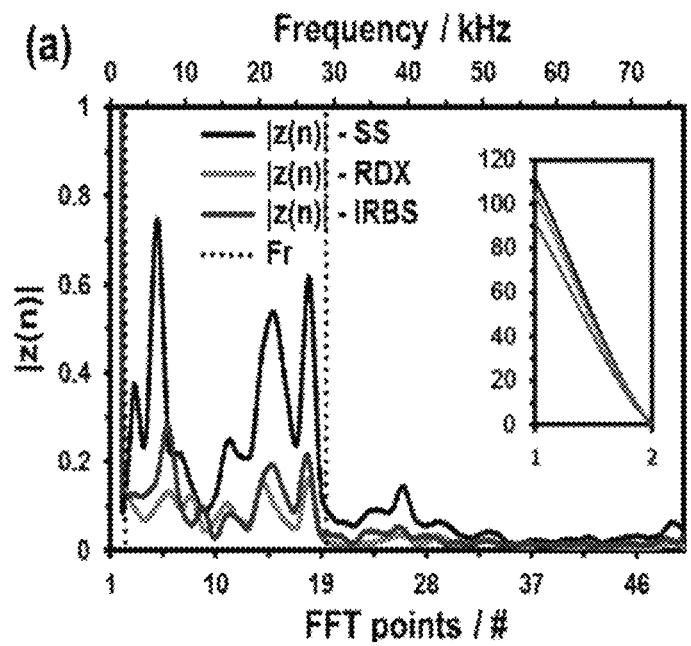
FIG. 16a shows FFT spectrum for n=100: |z(n)|. Inserts show that the first frequency term is orders of magnitude larger than other frequencies.
Figure 16B:
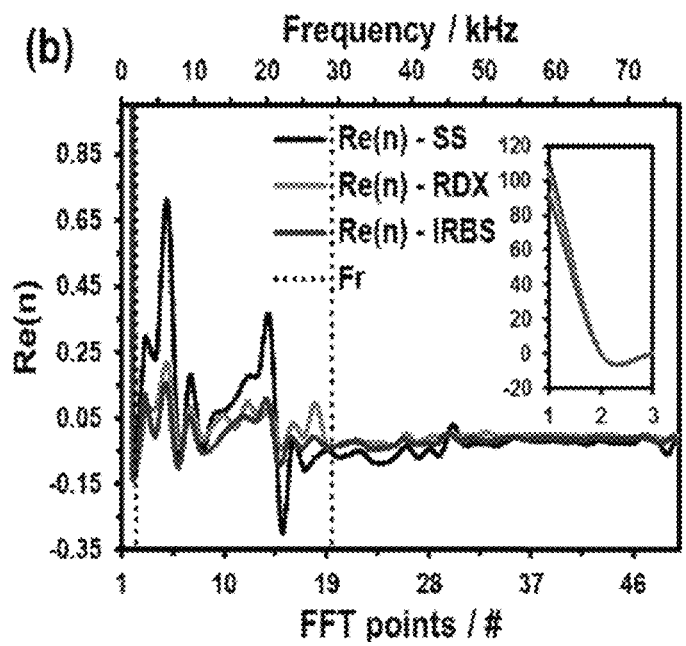
FIG. 16b shows FFT spectrum for n=100: Re(n). Inserts show that the first frequency term is orders of magnitude larger than other frequencies.
Figure 16C:
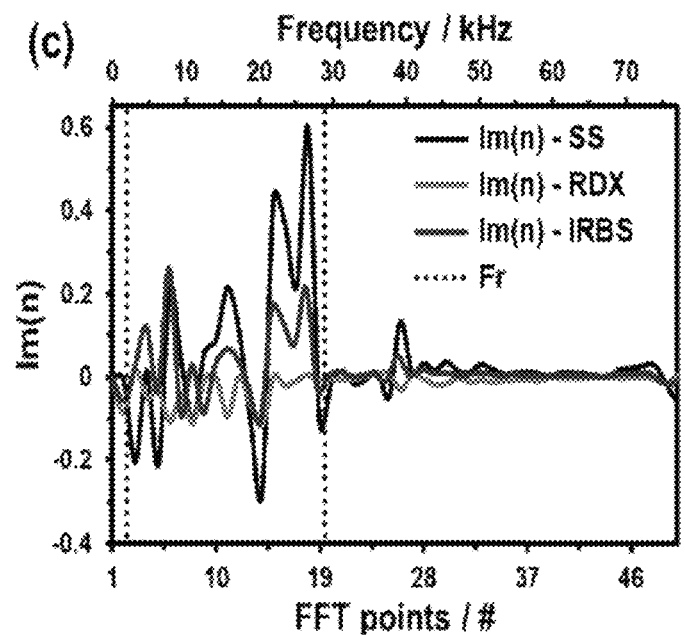
FIG. 16c shows FFT spectra for n=100: lm(n).

FIGS. 16a-16c show the spectral transformations for the clean SS steel and the substrate dosed with RDX and IRBS ~16 $ng/cm^2$ and ~60 $ng/cm^2$, respectively. The FFT shows each frequency component or mode that is generated in the interference pattern in the spectra. A detailed analysis of FIGS. 16a-16c evidence that the modes in the FFT spectra for substrates with RDX and IRBS are similar to the clean SS substrates, differing only in small modifications of these modes. These small modifications are due to the properties of the layer such as absorbance, homogeneity, refractive index, particle size, and the thickness of the layer. The functions of the FFT: $Re(\omega)$ and $|z(\omega)|$ have a mode with higher intensity at a frequency 2 kHz lower than all the other modes. This mode is due to the frequency independent (offset) component of the signal. Fr frequencies are due to the interference patterns observed in the spectra. These are found between 2 and 29 kHz. The shape and intensity of the signals in this range of frequencies are modified by the type of analyte present on the surface (FIGS. 16a-16c). These modes are the principal source of interferencees that are generated between the output lens of the QCL, and the mirror used for backward reflection of the MIR light. Frequencies larger than 29 kHz are typically overtones of Fr and other small interferences. The functions $|z(\omega)|$, $Re(\omega)$, and $Im(\omega)$ of the FFT the do not provide direct information on the index of refraction and the absorbance index because the data does not solely consist of diffuse reflectance information. Instead, information on other optical phenomena, such as specular reflectance, total internal reflectance, diffuse reflectance in backscattering, and of the interference fringes are all convoluted within the spectroscopic data.

Figure 16D:
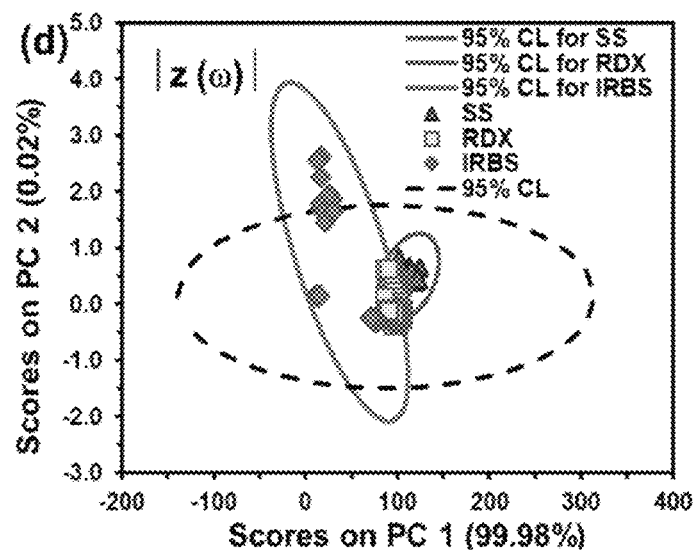
FIG. 16d shows a plot for PC 2 vs. PC 1 for the preprocessing function applied: |z(n)|, where dotted line traces represent 95% confidence limit.
Figure 16E:
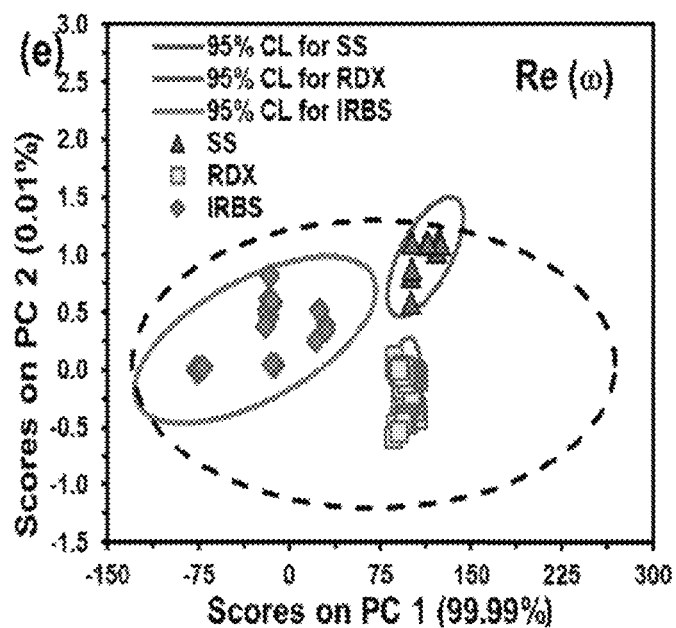
FIG. 16e shows a plot for PC 2 vs. PC 1 for the preprocessing function applied: Re(n), where dotted line traces represent 95% confidence limit.
Figure 16F:
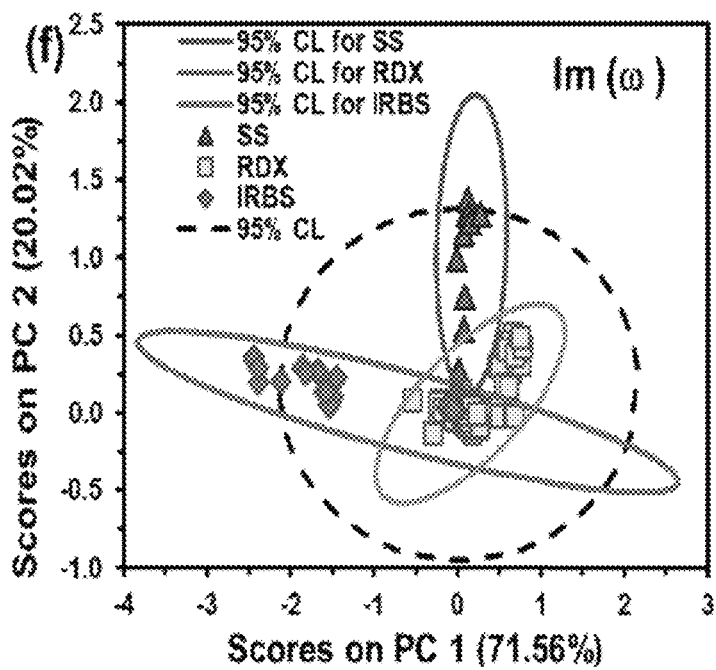
FIG. 16f shows a plot for PC 2 vs. PC 1 for the preprocessing function applied: lm(n), where dotted line traces represent 95% confidence limit.

FFT preprocessing functions of the data as well as other preprocessing functions applied to the data were used to build models based on principal components analyses (PCA) aimed at correlating the spectroscopic differences between the clean substrate and the analytes/substrate reflectance spectra. To select which principal components (PCs) were significant in conveying information about the analytes and substrates, the criterion of separation into classes was used. A complete separation using the first two principal components (PCs) into classes: clean substrates (SS), substrates with RDX (RDX/SS) and substrates with IRBS (IRBS/SS) was achieved using $Re(\omega)$, as shown in FIG. 16e. A slight separation was also observed using $|z(\omega)|$ (FIG. 16d) and no separation was achieved by using $Im(\omega)$ (FIG. 16f). When comparing with other preprocessing algorithms utilized, the separation in classes was not complete when the other preprocessing routines were applied. The other preprocessing routines used were standard normal variate (SNV), first derivative ($1^{st}$ Derv.), second derivative ($2^{nd}$ Derv.), multiplicative scatter correction (MSC), and extended multiplicative scatter correction (EMSC).

Figure 17A:
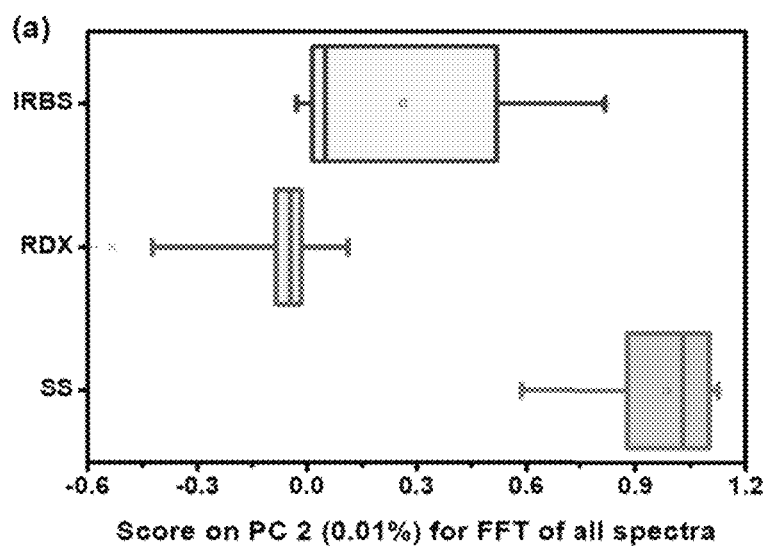
FIG. 17a shows a box plot for the PC 2 (0.01%) for all FFT spectra.
Figure 17B:
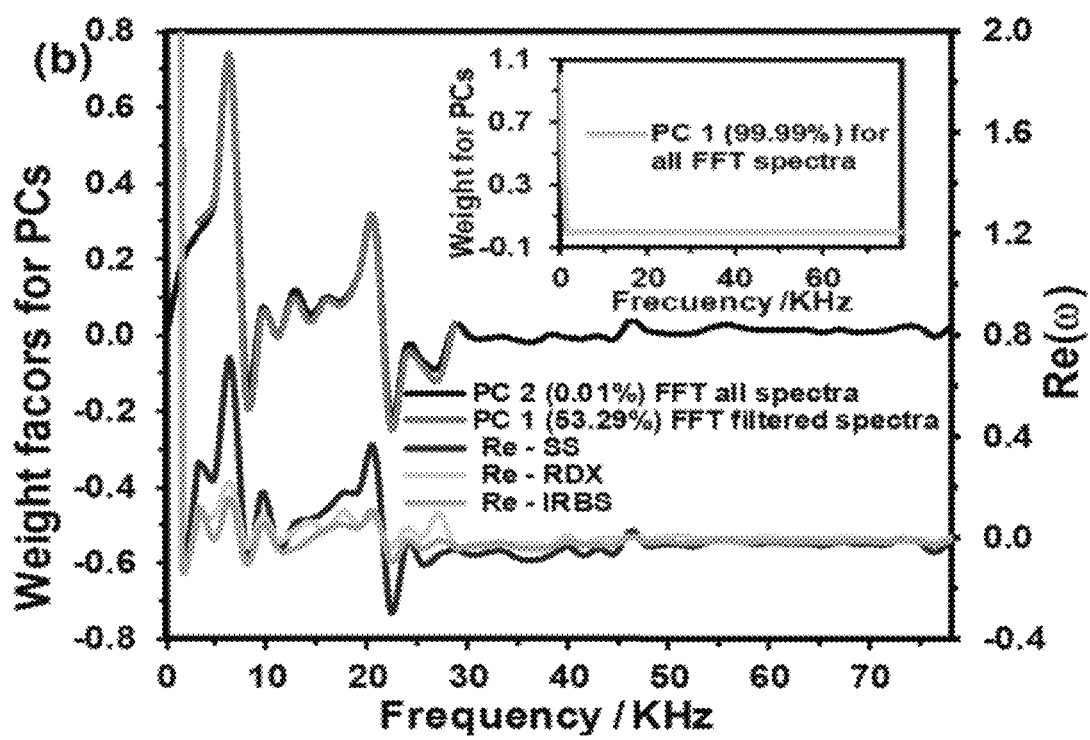
FIG. 17b shows weight factors spectra PC 2 (0.01%) for all FFT spectra, PC 1 (53.29%) for filtered FFT spectra and their comparison with FFT spectra of Re($\omega$) of SS, RDX and IRBS.

In the models for discriminations generated using the various preprocessing algorithsm, two main principal components (PCs) contained almost all the variance of the data: PC1 captured 99.99% of the variance, and PC2 caught only 0.01%. However, PC1 was not able to separate the different classes completely. Principally, PC2 was effective in separating the data into classes (see FIG. 16e). A box for PC2 using all FFT spectra was generated (see FIG. 17a) showing the distributions of the scores for PC2 for each class. A good separation of the classes is visualized. A Kruskal-Wallis test of multiple ranges revealed that there is a significant difference between the classes. The reason why PC1, is the component with the highest variance in the PCA, was not able to separate the classes completely is due to the very intense signal that occurs between 0-2 kHz. This frequency is attributed to the offset component of the signal (see insert in FIG. 16b), and the weights of PC1 in this region are very intense (see insert in FIG. 17b). The same situation was observed when using $|z(\omega)|$ for the corresponding PCA models, as can be observbed if FIG. 16a.

Figure 17C:
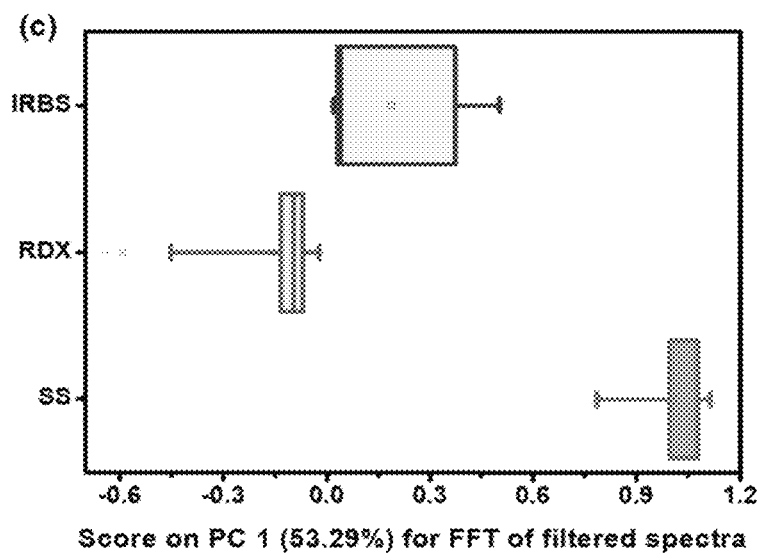
FIG. 17c shows a box plot for the PC 1 (53.29%) for filter FFT spectra.

Filtering of the FFT spectra was performed in the range of Fr(2-29 kHz). The filtering eliminated the intense signal present between 0-2 kHz and the high frequencies ($\omega$>29 kHz). After this, the PCA was relayed to finding only one necessary component for the total separation of the classes with a variance of 53.29% (FIG. 17c). A box plot using the scores for the PC1 was generated, and the visualization of the separation of the classes is better (see FIG. 17c). The weights of PC1 using this filter were compared with the weights for the PC2 using all FFT spectra. The similarity between them is very large, indicating that PC1 using all the FFT spectra mostly contains information of the offset component of the signal and when the filtering eliminates this signal, this first component is no longer necessary. Thus, a single component is necessary to generate a complete separation of the classes using Re( 7) as preprocessing.

Figure 17D:
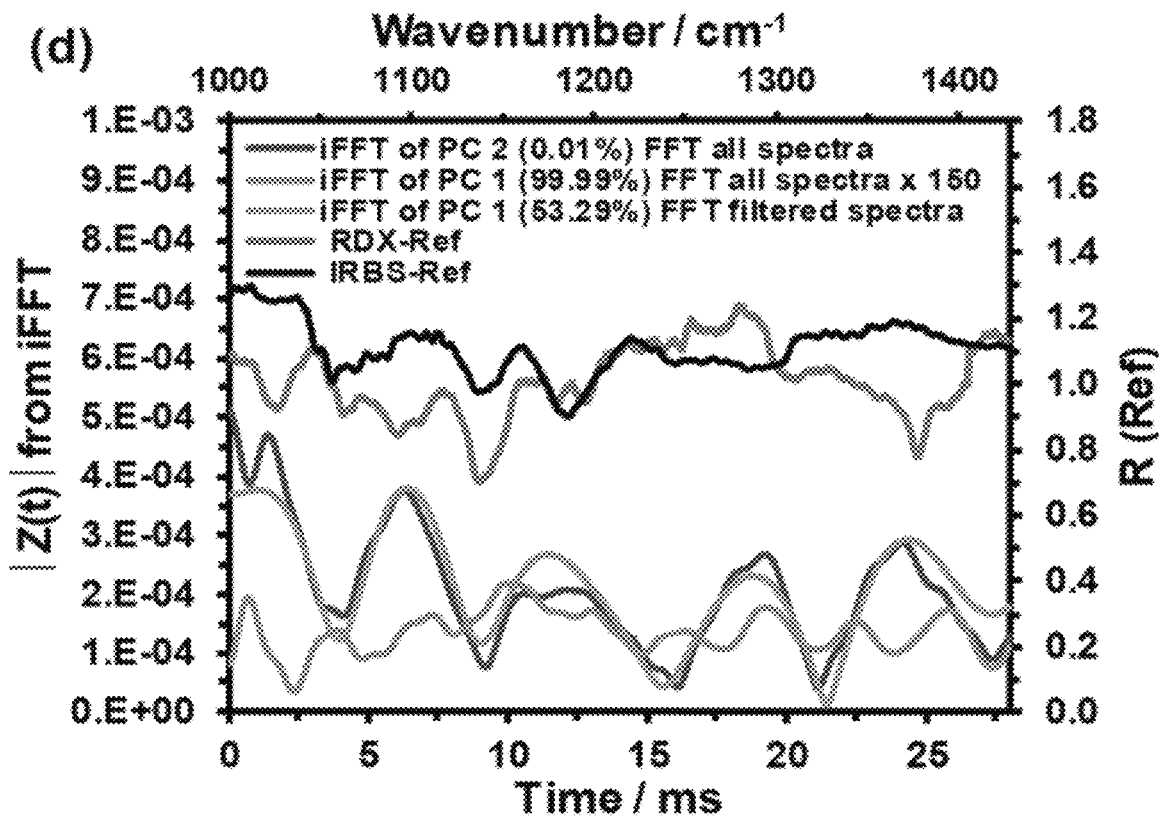
FIG. 17d shows iFFT spectra of PC 1 (99.99%) for all FFT spectra, PC 2 (0.01%) for all FFT spectra, PC 1 (53.29%) for filtered FFT spectra and their comparison with reflectance spectra of reference RDX and IRBS.

To verify if the weight factors of the PCs were in agreement to the spectroscopic signals, an inverse FFT (iFFT) was carried out on weights factors of the PCs. The results of this operation are shown in FIG. 17d. This transformation was compared with the reference spectra of RDX and IRBS, iFFT for PC2 using FFT for all the spectra was very similar to iFFT for PC1 using the FFT filtered spectra only. These were able to reproduce the signals of the reference spectra for RDX and IRBS. However, PC1 of FFT using all spectra had a great similarity to the RDX reference spectrum. This indicates that this PC can differentiate RDX from IRBS as shown in FIG. 16e.

To determine the method's discriminant capability, PLS-DA was employed using $Re(\omega)$ as a preprocessing routine. The number of points in the FFT was changed to select the best resolution for the analysis. The sensitivity and specificity for a leave one out cross validation (LOOCV) was also calculated for various number of points for the FFT analyses. The performances of the PLS-DA models were evaluated through the parameters of the confusion matrix, such as sensitivity and specificity for the validation of the models. The validations were initially evaluated in by the LOOCV procedure. The sensitivity is the number of samples predicted to be in the class divided by the actual number per class. The specificity is the number of samples predicted not to be in the class divided by the actual number, not in the class. The sensitivity and specificity were calculated according to Equations 2 and 3, respectively:

$$\text{Sensitivity} = \frac{TP}{TP + FN} \qquad (2)$$

$$\text{Specificity} = \frac{TN}{TN + FP} \qquad (3)$$

Where TP, FN, TN and FP represent the number of true positives, false negatives, true negatives, and false positives, respectively. The best models were generated using n=75 and n=100 points in FFT preprocessing (see Table 1). These models show very high sensitivity and specificity. The parameters for the cross-validation for all models are also shown in Table 1 for two latent variables.

TABLE 1

Sensitivity and specificity for LOOCV for two latent variables

| | Sensitivity (CV) | | | Specificity (CV) | | |
|---|---|---|---|---|---|---|
| # points | SS | RDX/SS | IRBS/SS | SS | RDX/SS | IRBS/SS |
| 10 | 0.900 | 0.893 | 0.708 | 0.885 | 0.765 | 0.737 |
| 20 | 1.000 | 1.000 | 0.958 | 1.000 | 1.000 | 0.974 |

TABLE 1-continued

Sensitivity and specificity for LOOCV for two latent variables

| | Sensitivity (CV) | | | Specificity (CV) | | |
|---|---|---|---|---|---|---|
| # points | SS | RDX/SS | IRBS/SS | SS | RDX/SS | IRBS/SS |
| 50 | 1.000 | 1.000 | 1.000 | 1.000 | 1.000 | 0.947 |
| 75 | 1.000 | 1.000 | 1.000 | 1.000 | 1.000 | 1.000 |
| 100 | 1.000 | 1.000 | 1.000 | 1.000 | 1.000 | 1.000 |
| 200 | 1.000 | 1.000 | 1.000 | 0.962 | 1.000 | 1.000 |
| 500 | 1.000 | 1.000 | 1.000 | 0.904 | 1.000 | 1.000 |
| 750 | 0.900 | 1.000 | 0.833 | 0.885 | 0.912 | 0.912 |
| 1000 | 1.000 | 0.893 | 0.792 | 0.885 | 1.000 | 0.737 |

Quantitative analysis

Quantification analyses were carried out using the same data. In cleaning validation processes, the quantification of traces of APIs, excipients, or detergents on the surface of batch reactors and other processing equipment is very important because the cleaning protocols require a minimum concentration on the surfaces that the chemicals are in contact with to prevent corss-contamination. To demonstrate the capability of the technique for quantification, PLS analyses were used to generate prediction models for the API selected. Although the quantification of explosives on surfaces is not essential in security protocols, detection and identification are of great importance.

Figure 18A:
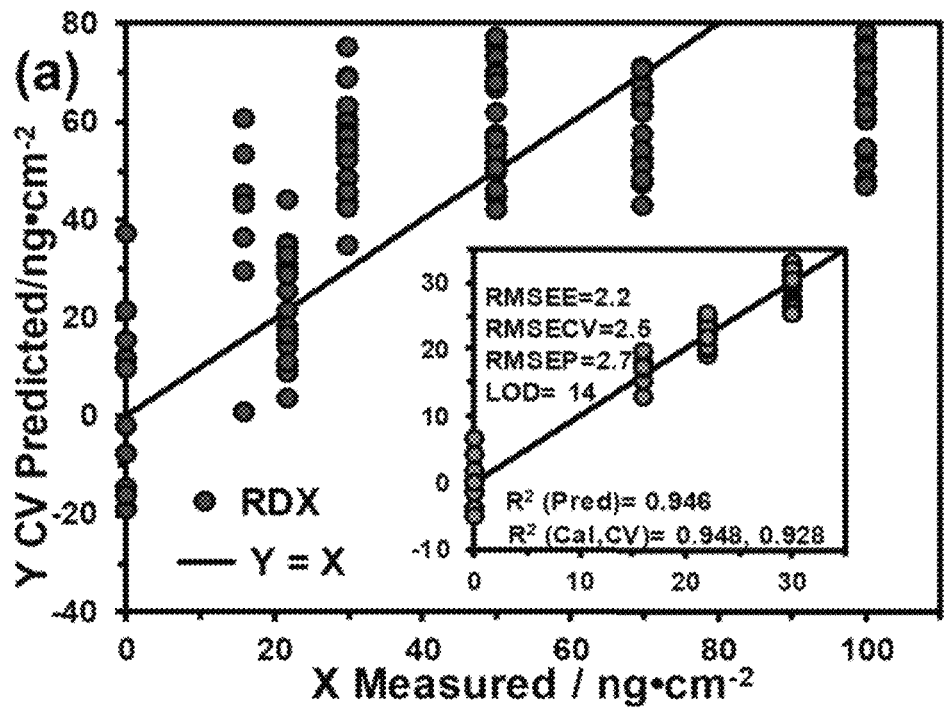
FIG. 18a shows predicted vs. nominal values for PLS modeling of the data: RDX model.
Figure 18B:
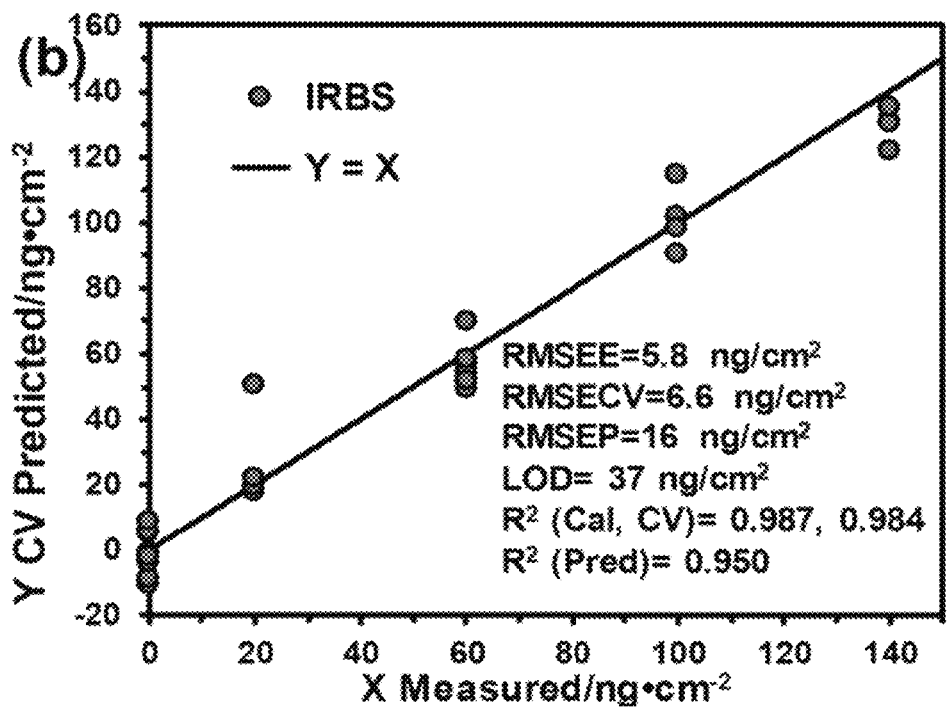
FIG. 18b shows predicted vs. nominal values for PLS modeling of the data: IRBS model.

The results of the PLS models are shown in FIGS. 18a-18b for RDX/SS and IRBS/SS using Re($\omega$) as a preprocessing step. Each point represents the average sample spectra for each surface loading. Two models for quantification for RDX were generated for different ranges of concertation of 0-100 ng/cm$^2$ and 0-30 ng/cm$^2$. The model at high concentration was not relevant because there was not a good correlation and a high error. When the concentration range was reduced the figures of merit for the model improved significantly as can be observed in the insert in FIG. 18a.

Values of the relevant statistical parameters of the PLS models are summarized in FIGS. 18a-18b. The accuracies of the PLS models were evaluated using the values of the root mean square error of estimation (RMSEE). The accuracies for the prediction of the same samples used in the PLS model were evaluated using the values of the root mean square error of cross-validation (RMSECV) and the external validation were evaluated with root mean square error of prediction (RMSEP). The linearity of the PLS models was evaluated by the coefficient of determination (R$^2$) for the calibration (Cal), cross-validation (CV) and prediction (Pred), which contain information on the percentage of variance that is present in the reference surface concentration values that are reproduced in the PLS regression. Optimum values were found, indicating good linearity. The systematic errors can be determined from the bias value, which is the average of the predicted values by cross-validation. This value was small in comparison to the range of the curve and the LOD values, indicating that the deviations in sample preparation were insignificant.

Figure 18C:
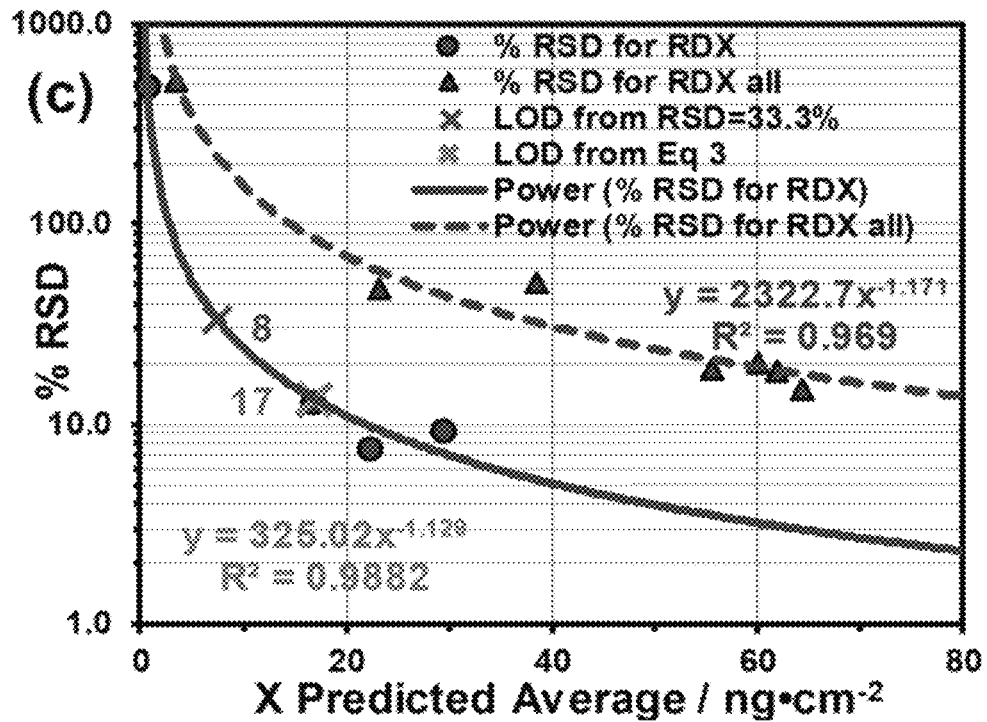
FIG. 18c shows % RSD vs. predicted average concentration and the power fits for RDX model.
Figure 18D:
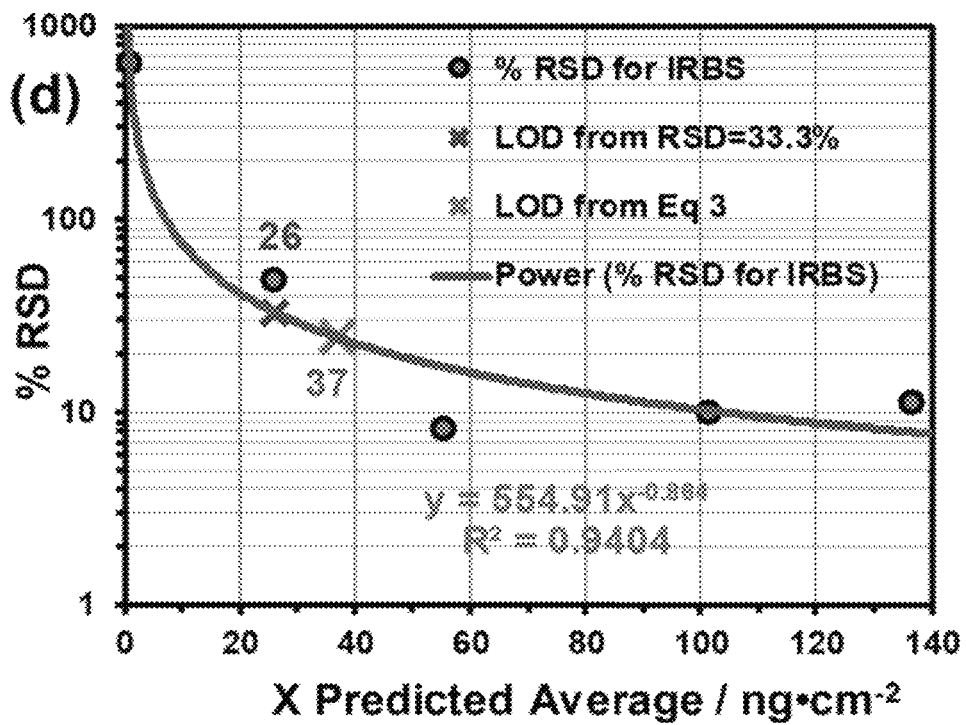
FIG. 18d shows % RSD vs. predicted average concentration and the power fits for IRBS model.

The LOD is the most controversial parameter in PLS analysis: consequently, various reports discuss several equations for calculating LOD values, LOD values were estimated using two ways. First, from the following equation:

$$\text{LOD} = \Delta(\alpha, \beta) * (\text{RMSEE} * \sqrt{1+h_o}) \quad (4)$$

Where the leverage ($h_o$) is the distance of the predicted sample from the calibration set mean at zero concentration (average of absolute value for the prediction of zero concentration), and $\Delta(\alpha,\beta)$ is a statistical parameter that is correlated to the $\alpha$ and $\beta$ probabilities of falsely stating the presence/absence of the analyte. Because the value for the degrees of freeom is >25, $\Delta(\alpha,\beta)$=3.3 was used to compute the LOD values The LOD value for IRBS/SS model was 37 ng/cm$^2$, and for the RDX model was 17 ng/cm$^2$. The second methodology used for calculating the LOD values depends on the relative standard deviation (RSD), which was calculated for each predicted concentration. A plot of the precision regarding the RSD values vs. predicted average concentration was generated and fitted. A power fit was used to calculate the LOD value by interpolation of the concentration for 33.3% of RSD. This procedure is in accord with the IUPAC recommendation. The LOD values found were 26 ng/cm$^2$ for IRBS and 8 ng/cm$^2$ for RDX (see FIGS. 18c-18d).

The present invention has applicability in various fields and technologies, some of which will be described below.

Cleaning Validation in Pharmaceutical and Biotechnology Industries

Cleaning validation (CV) processes are in demand for implementation in pharmaceutical, biotechnology, and consumer products industries. The methodologies developed for CV differ based on the equipment usage, manufacturing stage, the nature of the active pharmaceutical ingredients (APIs), excipients, detergents and cleaning agents, and solvents used for manufacturing and cleaning. These chemicals leave residues on equipment used in manufacturing and handling processes. Mid-infrared quantum cascade laser spectroscopy (QCLS) operating close to the grazing angle followed by the application of multivariate statistical tools, such as partial least squares, partial least squares-discriminant analysis, and support vector machine regression is proposed. These results highlight the efficiency of QCLS in quantifying individual APIs and mixtures at low surface concentrations. The over-the-counter active ingredients (OTC-AIs) used in this application included salicylic acid (SA), methylparaben (MP), propylparaben (PP), ethylparaben (EP), avobenzone (AB), oxybenzone (OB), octocrylene (OC), octinoxate (OMC), octisalate (OS), homosalate (HS), and titanium (IV) dioxide (TiO$_2$). These chemicals are listed as ingredients of over-the-counter consumer care product (OTC-CCP) formulations. OTC-AIs were diluted in methanol to produce stock solutions for depositing on substrates at various surface concentration to allow determining the detection limits (DL) and upper detection limits (UDL). Samples were deposited in the range of 0.5-1000 μg/cm$^2$ using a smearing method that consisted of transferring 100 μL while dragging the micropipette disposable tips onto 316-L stainless steel (SS) substrates that measured 5 cm×5 cm. The substrates were then left to dry before analysis. Measurements were obtained in reflectance mode using two LaserScan™ spectrometers (QCLS), which were acquired from Block Engineering, LLC (Marlborough, Mass., USA), with the capability to detect concentrations 1 μg/cm$^2$. The first of the MIR spectrometers (QCLS-I) had a tuning range of 1000 to 1630 cm$^{-1}$, while QCLS-II could be scanned from 800 to 1450 cm$^{-1}$. A 75-mm diameter ZnSe lens allowed for beam collimation up to 15 cm from the instrument's front lens and for back-reflected light collection. Twenty spectra were acquired for each target concentration, with 3 co-adds per acquisition.

Figure 7:
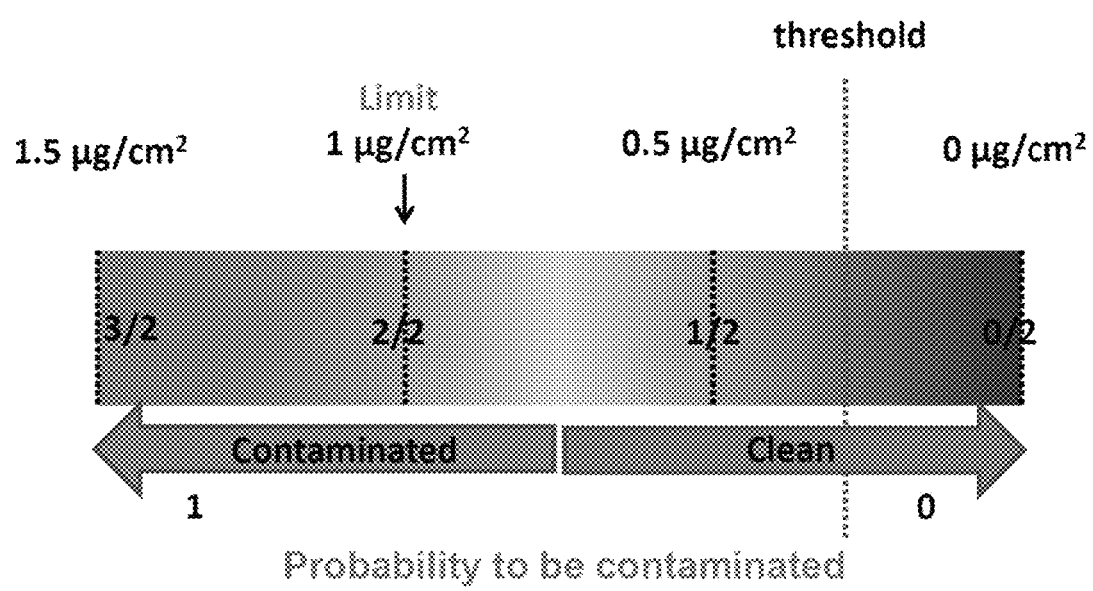
FIG. 7 shows the proposed parameters for the PLS-DA model constructed, according to the present invention.
Figure 8:
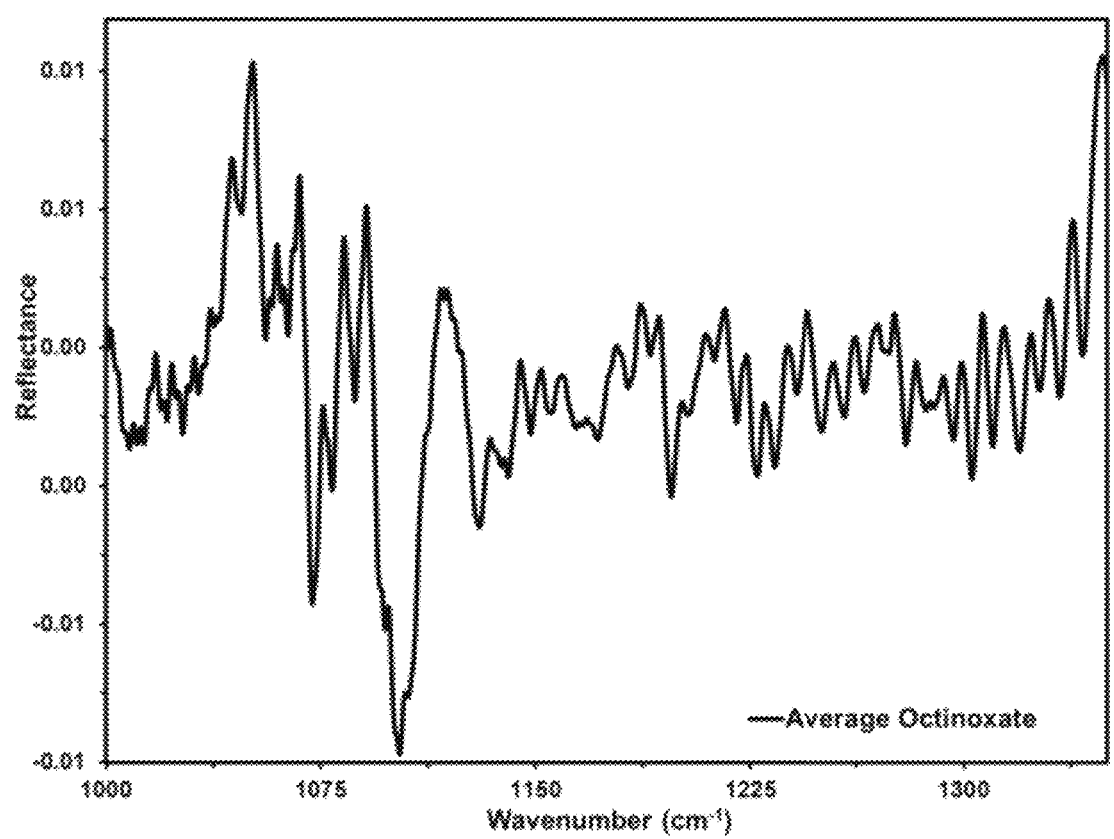
FIG. 8 shows reflectance spectra of octinoxate (OMC) using the grazing angle probe and excited with a QCL, according to the present invention.

Stainless steel substrates were used for the spectroscopic analysis to simulate real manufacturing surfaces. Samples were deposited using a smearing methodology. Several over-the-counter active ingredients (OTC-AI) in finished product formulations were analyzed by QCLS and validated using a high-performance liquid chromatography-diode array detector (HPLC-DAD). Excipient concentrations of 40 μg/cm² were predicted for OTC consumer care products with partial least squares. Detection limits of 0.06 μg/cm² were found for QCLS for salicylic acid and validated with HPLC-DAD. A clean SS plate was used to measure background spectra before each spectral acquisition. Twenty spectra were collected per substrate, with three co-adds per concentration. The area covered by this setup measured 4 mm×40 mm, covering 1.6 cm² of a total substrate area of 25 cm². After the data collection process, chemometrics analyses were performed using the PLS_Toolbox 7.9 software package (Eigenvector Research, Inc., Wenatchee, Wash., USA) running on the MATLAB® 7.13 platform (R2011b; The Math Works, Inc. Natick, Mass., USA). Chemometrics techniques employed to generate models for classification and discrimination of the samples were PLS, PLS-DA, and SVMR for SA. The trials provided excellent results for a qualitative pass-or-fail test on OTC-AIs with parameters shown in FIG. 7. Reflectance spectra of octinoxate (OMC) using the grazing angle probe and excited with a QC are shown in FIG. 8.

Several surface concentrations were used to generate the PLS models. These models were in turn used to find DL values and the capability of the technique to quantify the data. The detection limit (DL) values were calculated from the relative standard deviation (RSD). The RSD values were calculated for each concentration per the predicted value output for PLS runs as the average divided by the standard deviation. A plot of the precision in terms of the RSD (%) vs. average concentration predicted was generated and fitted. Power fits were used to calculate the DL values and the quantification limit (QL) values by interpolating the concentration for 33.3% and 10% RSD, respectively. This method is in accordance with IUPAC recommendations; wherein pre-processing methods were employed.

OB samples in methanol were increased in concentration from 300-1200 ppm (mg/kg), resulting in a surface concentration of 17 to 70 μg/cm². The results are shown in Table 2 below in terms of predicted concentration values.

TABLE 2

| Average concentration; n = 20 (μg/cm²) | OB RSD (%) |
|---|---|
| 3 | 41.1 |
| 17 | 29.4 |
| 44 | 17.5 |
| 60 | 22.9 |
| 64 | 15.8 |
| DL | 7.03 |
| QL | 21.1 |
| R² | 0.8426 |
| RMSECV | 8.0 |
| $s_{R,p}$ (%) | 6.1 |

The preprocessing methods used were SNV and first derivative. Increased variation was observed with the grazing angle setup as the sample was rastered in 4 mm steps per spectra using a sample holder. The regions analyzed were 1173.6-1293.4, 1333.6-1353.4, and 1373.6-1413.4 cm⁻¹. Additionally, the DL was lower than the RMSECV; therefore, this benzone OTC-AI was not feasible to measure with the QCL-GAP below 8 μg/cm². A low coefficient of determination (0.8773) was obtained. High RSD percentages were noticed per concentration with a DL of 7 μg/cm² and a QL of 21 μg/cm². Four latent variables were included in the analysis. A pooled RSD value of 6.1% was reported per IUPAC standards.

$$S_{R,p} = \sqrt{\frac{\Sigma(n_i - 1)s_{r,i}^2}{\Sigma(n_i - 1)}}$$

In this Equation, n is the number of measurements, and $s_{r,i}$ represents the RSD value per concentration, i. The RSD at the right of each concentration represents the percentage within-class, per concentration.

Microorganism Detection and Discrimination

Figure 9:
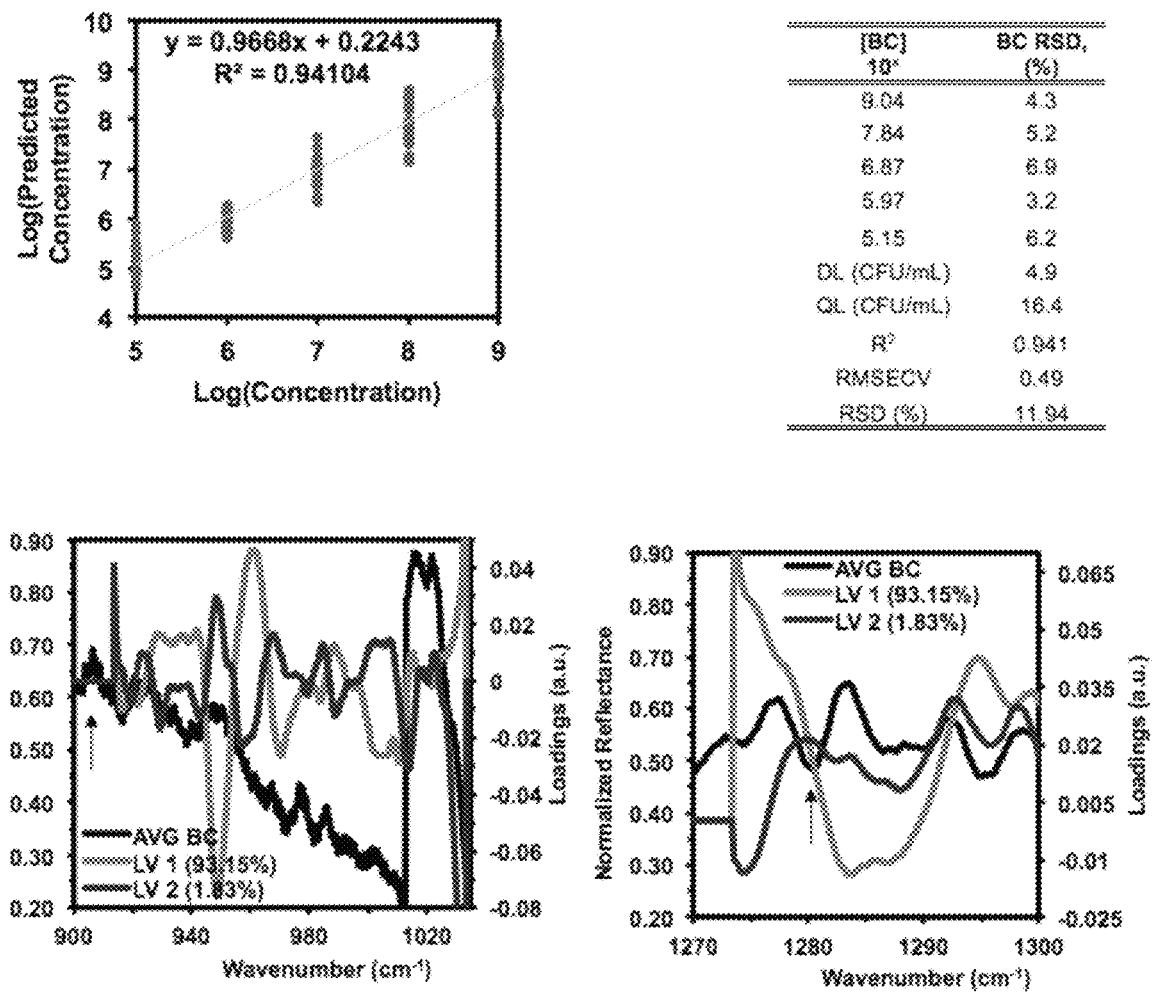
FIG. 9 shows the results for the PLS model for BC with clean and log(conc.) values: $10^2$-$10^7$, according to the present invention.
Figure 10:
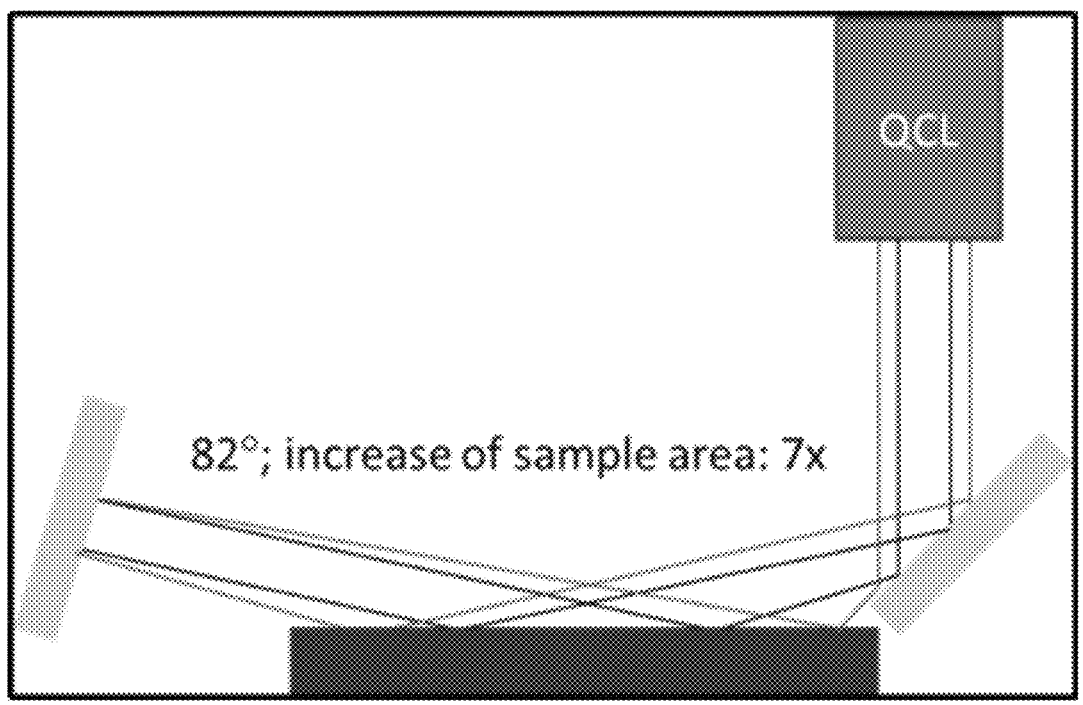
FIG. 10 shows a grazing angle probe mount for existing QCL spectrometer.
Figure 11:
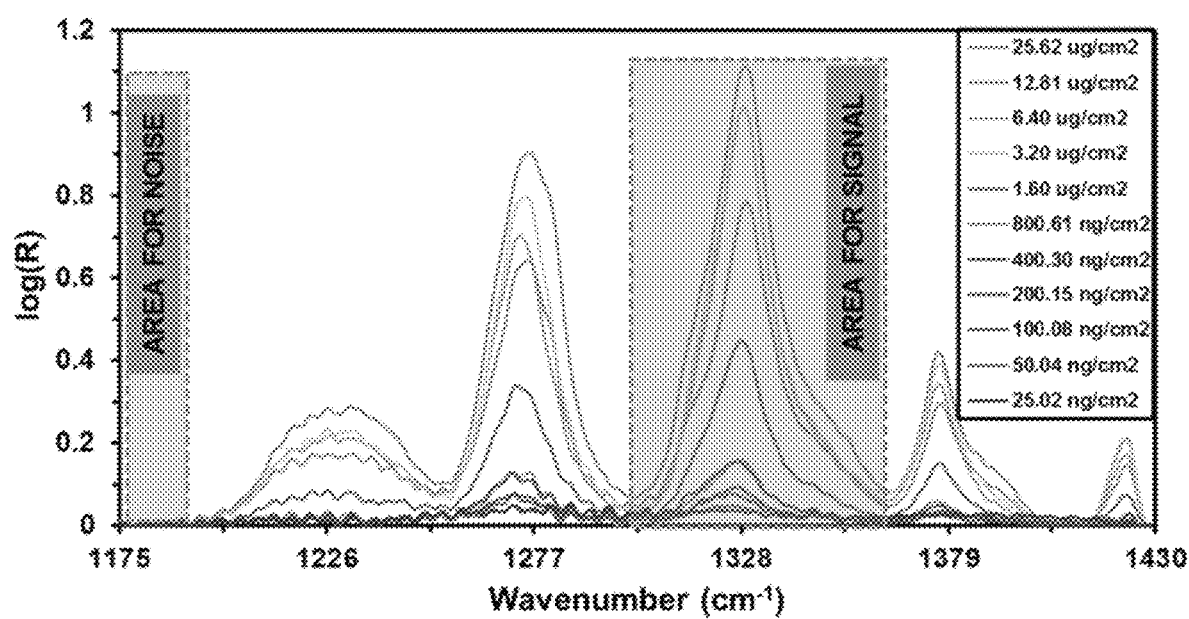
FIG. 11 shows reflectance spectra of RDX as a function of the surface concentration using QCL-GAP setup, according to the present invention.
Figure 12:
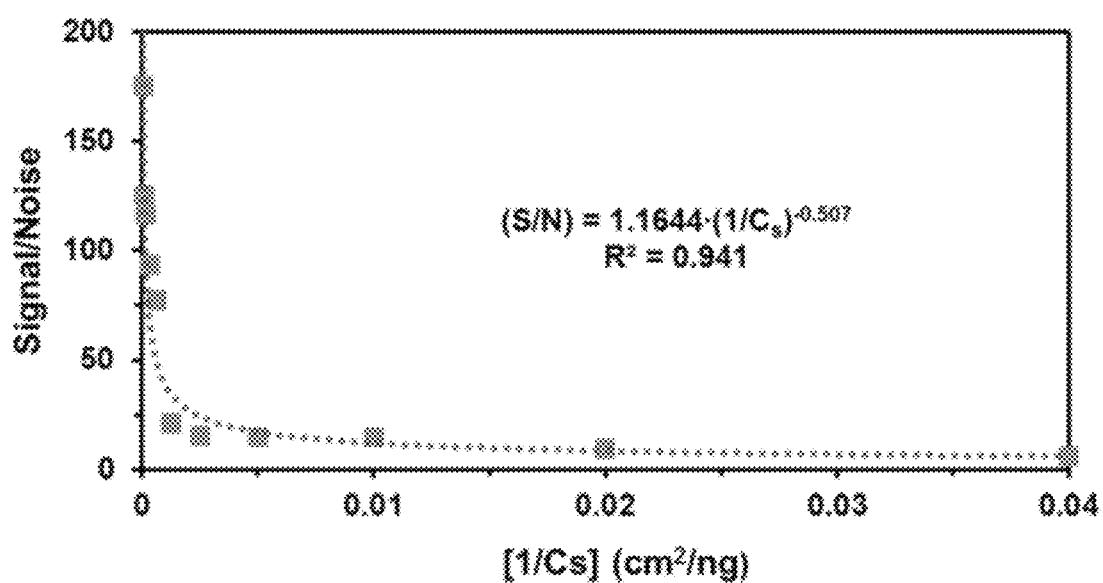
FIG. 12 shows a plot of signal/noise (S/N) as a function of reciprocal of surface concentration to determine the value of the detection limit (DL), according to the present invention.

*B. cepacia* (BC) is a pathogen that accumulates in the lungs of patients with cystic fibrosis. Five regions are usually examined in the MIR to differentiate bacteria. One of the most important is the fingerprint region from 500-1000 cm⁻¹ that was analyzed by a second QCLS from 913.6-1033.4, 1113.6-1153.4, and 1273.6-1393.4 cm⁻¹ to identify aromatic ring vibrations from aromatic amino acids. Limitations of the original setup with QCLS provide other regions for identification of the amide bands from the C=O vibrational modes of the peptide backbone. The second region analyzed from 1500-1200 contains a combination of bending vibrations of proteins and phosphate compounds from CH₃ linked to amide bands. The 1200-900 cm⁻¹ region includes cell wall, polysaccharides, and nucleic acids that involve C—O—C, C—O—H, C—O deformation, as well as C—O—P stretches. The strongest band is usually the 1082 cm⁻¹ involving C—O—C from the sugar skeleton. FIG. 9 shows amide III band with dipicolinic acid at 1280 cm⁻¹. The second derivative was successful in the elucidation of overlapping vibrational modes as seen in literature. PLS calibration curves in FIG. 9 for BC show the model resulting from pre-processed data in the fingerprint region.

Explosives Detection

MIR spectroscopy operating at the grazing angle of incidence is the most sensitive optical absorption technique available for measuring low chemical concentrations on surfaces such as metals. Also, QCL spectroscopy can be used outside the confinement of the sample compartment, making it available for fieldwork. Thermal source (Globar) Fiber Optic Coupled Grazing Angle Probe Reflection Absorption Infrared Spectroscopy (FOC-GAP-RAIS) has been investigated before as a powerful tool to develop techniques for the detection of explosives residues on surfaces. The methodology is remotely sensed, in situ and can detect nanograms of the compounds. It is solvent free and requires no sample preparation. Samples with surface concentrations (Cs) ranging from micrograms/cm² to nanograms/cm² of explosives: DNT, TNT, PETN, nitroglycerine (NG) and triacetone triperoxide (TATP) were studied on stainless steel plates with excellent results yielding 10-100× lower limits of detection (LODs) for explosives than for active pharmaceutical ingredients, for which the setup was originally developed. A setup for coupling a QCL spectrometer to a home-built grazing angle probe as illustrated in FIG. 4, was successfully tested for explosives detection on substrates.

The limitation imposed by the available QCL spectrometer is related to the instrument design in which the MIR detector is located within the spectrometer and that the system operates only collecting the back-reflected light. The results on detection of explosives residues on stainless steel plates with the setup illustrated in FIG. 4 are highly encouraging: 460 pg/cm² for ammonium nitrate, 73 pg/cm² for RDX, and 35 pg/cm² for PETN. These values are ~$10^2$-$10^3$ times lower than currently reported LOD values for these explosives. It also envisioned that the MIR detector could be placed at the plane of the second gold-coated mirror and placed at 82° from the surface normal with the results shown in FIG. 4 and FIG. 5.

Conclusions

A novel grazing-angle probe designed to be interfaced to a QCL-based spectrometer is presented. This unit enables RAIS measurements in the MIR under conditions of a polarized, high brightness laser source. Upon implementation of the new technique for surface contamination analysis in two broad areas, pharmaceutical reactor cleaning validation and in high explosives detection for defense and security applications, interference back-reflection patterns were observed that initially hindered the successful application of the technique. To take full advantage of the potential of the spectroscopic technique, a preprocessing algorithm based on FFT was implemented in MATLAB and successfully tested. Three derived functions were used: the absolute value of the complex function of the FFT ($|z(\omega)|$), the imaginary part of the FFT complex function ($Im(\omega)$) and the real part of the complex function of the FFT ($Re(\omega)$).

The optimization of the preprocessing steps was found upon evaluation of four preprocessing models for quantitative and qualitative analysis. The preprocessing options to evaluate PLS quantification models and PCA qualitative models improved when the Re(n) was used. Using this preprocessing function allowed a complete separation of three classes: the clean substrates (SS), explosive on substrates (RDX/SS) and active API on substrates (IRBS/SS). Sensitivity and specificity values of 1,000 for both RDX and IRBS were obtained using 75 and 100 points of FFT preprocessing.

The QCL-GAP back-reflection setup described herein can provide the basis to develop methodologies for high specificity and sensitivity results for low concentration analysis using RAIS measurements. These results will have a far-reaching impact in cleaning validation in pharmaceutical and biotechnology industries, in defense and security applications, including improvement of decontamination protocols, detection, and discrimination of biofilms, detection pollutants, and many other applications involving monolayer analysis.

Although the invention has been described in conjunction with specific embodiments, it is evident that many alternatives and variations will be apparent to those skilled in the art in light of the preceding description. Accordingly, the invention is intended to embrace all of the alternatives and variations that fall within the spirit and scope of the invention.

We claim:

1. A grazing angle probe mount for quantum cascade lasers comprising:
   a mid-infrared (MIR) laser source coupled to an optical probe with mirrors oriented to reflect light at a grazing angle to a surface of a sample;
   the optical probe including:
   a ZnSe lens that focuses a beam towards the surface and in a direction normal to the surface;
   a first gold-coated plane mirror oriented at 49° to the surface that deflects the beam at an angle of 8° to the surface to form a first elliptical beam image on the surface of the sample during a first pass of the beam; and
   a second gold-coated plane mirror oriented at 8° to a normal of the surface that reflects the beam to form a second larger elliptical beam image at a same position on the surface of the sample as the first elliptical beam image during a second pass of the beam.

* * * * *